US012575290B2

(12) United States Patent
Jin et al.

(10) Patent No.: US 12,575,290 B2
(45) Date of Patent: Mar. 10, 2026

(54) DISPLAY PANEL, METHOD FOR MANUFACTURING DISPLAY PANEL AND DISPLAY DEVICE

(71) Applicant: BOE TECHNOLOGY GROUP CO., LTD., Beijing (CN)

(72) Inventors: Qian Jin, Beijing (CN); Dejiang Zhao, Beijing (CN); Wei Huang, Beijing (CN); Qian Sun, Beijing (CN); Tianhao Lu, Beijing (CN); Yang Li, Beijing (CN); Yu Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 750 days.

(21) Appl. No.: 17/799,462

(22) PCT Filed: Sep. 2, 2021

(86) PCT No.: PCT/CN2021/116218
§ 371 (c)(1),
(2) Date: Aug. 12, 2022

(87) PCT Pub. No.: WO2023/028945
PCT Pub. Date: Mar. 9, 2023

(65) Prior Publication Data
US 2024/0188368 A1     Jun. 6, 2024

(51) Int. Cl.
*H10K 59/38*     (2023.01)
*H10K 50/858*     (2023.01)
(Continued)

(52) U.S. Cl.
CPC ........... *H10K 59/38* (2023.02); *H10K 59/126* (2023.02); *H10K 59/351* (2023.02);
(Continued)

(58) Field of Classification Search
CPC ...... H10K 59/126; H10K 59/38; H10K 59/35; H10K 59/351
See application file for complete search history.

(56) References Cited

U.S. PATENT DOCUMENTS 11,637,260 B2 *     4/2023     You ...................... H10K 50/125
                                                              257/79
2014/0062292 A1     3/2014     Seong
                    (Continued)

FOREIGN PATENT DOCUMENTS

CN          110335883 A     10/2019
CN          111129271 A     5/2020
                    (Continued)

OTHER PUBLICATIONS

European Patent Office, Extended European Search Report, Apr. 2, 2024, Appl'n No. EP21955485.4.

*Primary Examiner* — William N Harris
(74) *Attorney, Agent, or Firm* — HOUTTEMAN LAW LLC

(57) ABSTRACT

Provided are a display panel and a method for manufacturing the same, and a display device. The display panel includes: a first base substrate; color control units on a side of light-emitting units away from the first base substrate, the color control units correspond to the light-emitting units one to one; at least part of the light-emitting units are each provided with a diaphragm structure, the diaphragm structures are located between the light-emitting units and the color control units, each diaphragm structure is provided with a light passing portion therein; each diaphragm structure is configured to block light from the light-emitting unit and directed to the color control units not corresponding to the light-emitting unit, and allow part of light from the light-emitting unit and directed to the color control unit corresponding to the light-emitting unit to be transmitted at the light passing portion corresponding to the light-emitting unit.

20 Claims, 15 Drawing Sheets

(51) Int. Cl.
| | |
|---|---|
| *H10K 59/126* | (2023.01) |
| *H10K 59/35* | (2023.01) |
| *H10K 59/80* | (2023.01) |
| *H10K 102/00* | (2023.01) |

(52) U.S. Cl.
CPC ....... *H10K 59/879* (2023.02); *H10K 59/8792* (2023.02); *H10K 50/858* (2023.02); *H10K 59/873* (2023.02); *H10K 2102/351* (2023.02)

(56) References Cited

U.S. PATENT DOCUMENTS

| | | | |
|---|---|---|---|
| 2020/0144333 A1* | 5/2020 | Kim | H10K 50/828 |
| 2020/0168667 A1* | 5/2020 | Kim | H10K 59/50 |
| 2020/0365833 A1* | 11/2020 | Joo | H10K 59/8731 |
| 2021/0005672 A1* | 1/2021 | Lee | H10K 59/38 |
| 2021/0066670 A1* | 3/2021 | Matsuoka | H10K 50/865 |
| 2021/0074769 A1* | 3/2021 | Park | H10K 59/12 |
| 2021/0074770 A1* | 3/2021 | Choe | G02B 5/206 |
| 2022/0085334 A1* | 3/2022 | Oh | H10K 50/858 |

FOREIGN PATENT DOCUMENTS

| | | |
|---|---|---|
| CN | 111146248 A | 5/2020 |
| CN | 111952329 A | 11/2020 |
| CN | 112186009 A | 1/2021 |
| CN | 112466908 A | 3/2021 |
| CN | 112490385 A | 3/2021 |
| CN | 113013310 A | 6/2021 |
| CN | 113261128 A | 8/2021 |
| JP | 2015128027 A | 7/2015 |

\* cited by examiner (--Prior Art--)

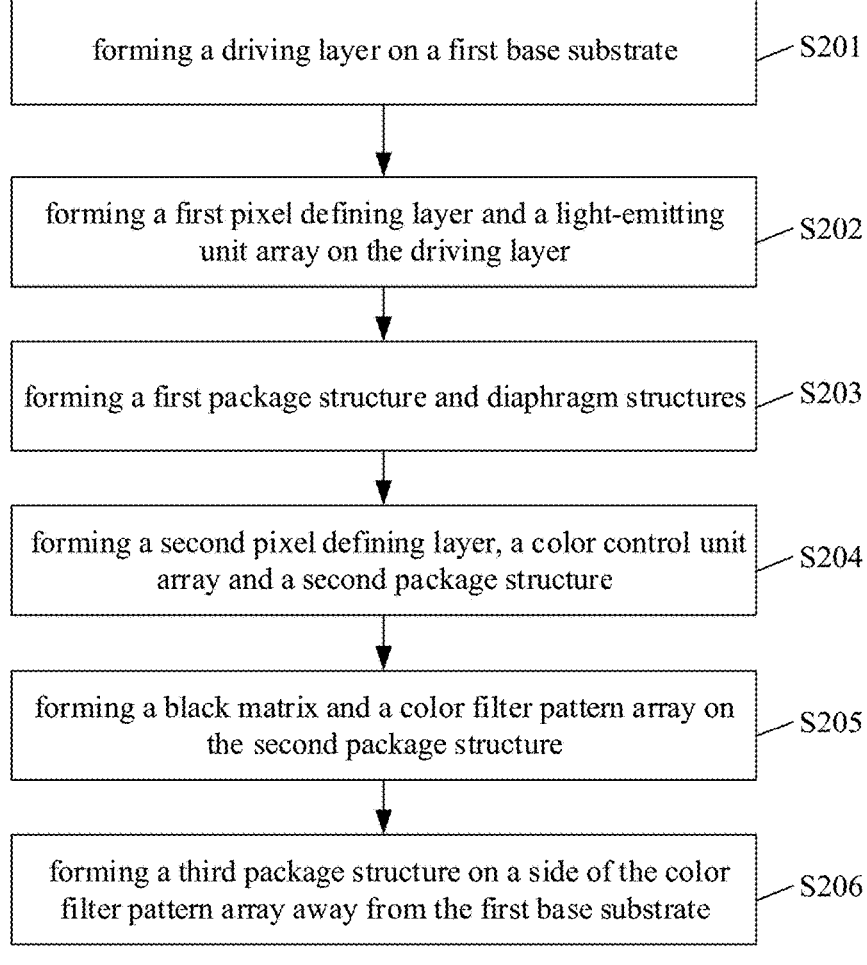

| forming a driving layer on a first base substrate | S201 |

| forming a first pixel defining layer and a light-emitting unit array on the driving layer | S202 |

| forming a first package structure and diaphragm structures | S203 |

| forming a second pixel defining layer, a color control unit array and a second package structure | S204 |

| forming a black matrix and a color filter pattern array on the second package structure | S205 |

| forming a third package structure on a side of the color filter pattern array away from the first base substrate | S206 |

S203 forming a first inorganic package layer on a side of the light-emitting unit array away from the first base substrate — S2031a

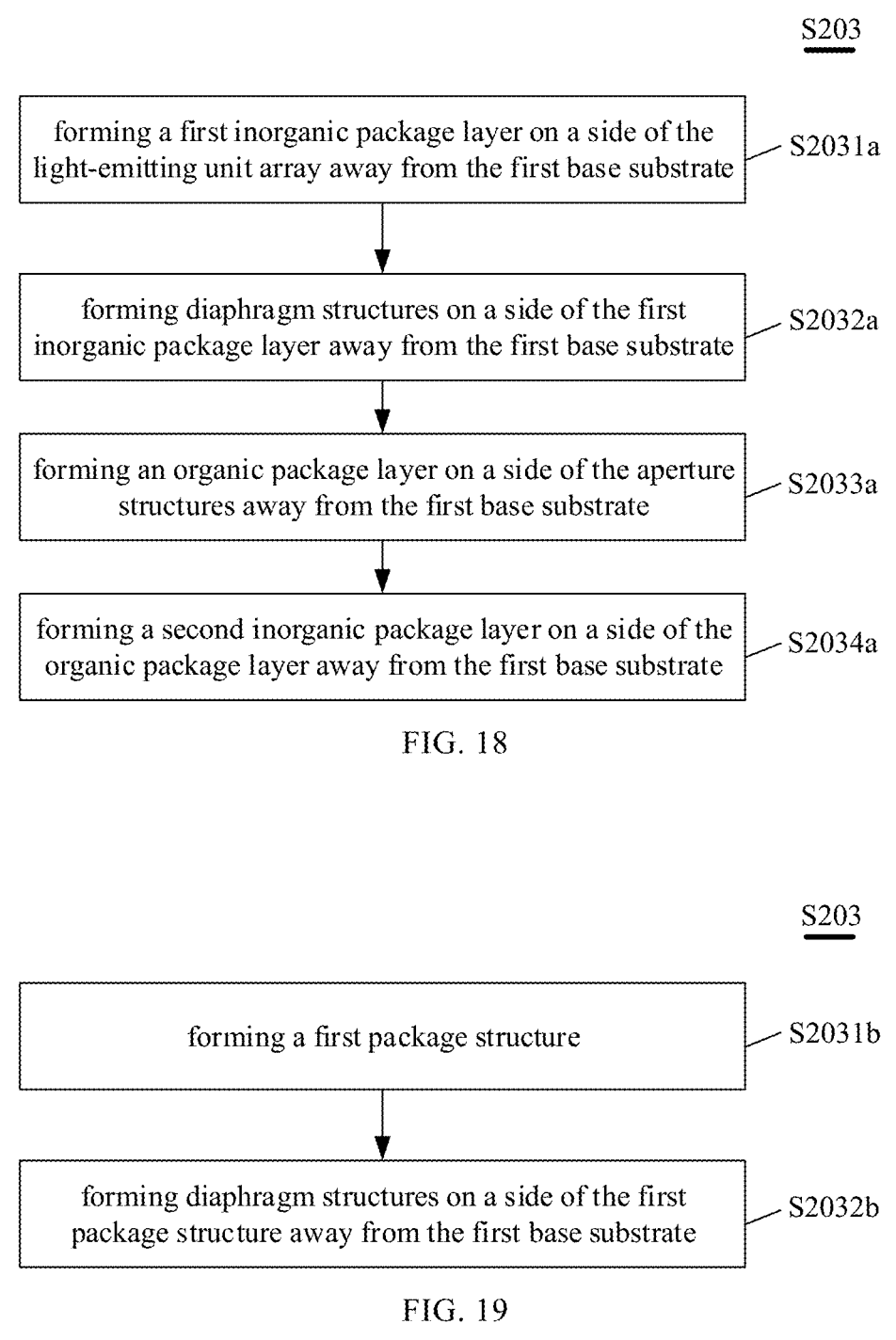

↓ forming diaphragm structures on a side of the first inorganic package layer away from the first base substrate — S2032a

↓ forming an organic package layer on a side of the aperture structures away from the first base substrate — S2033a

↓ forming a second inorganic package layer on a side of the organic package layer away from the first base substrate — S2034a

FIG. 18

S203 forming a first package structure — S2031b

↓ forming diaphragm structures on a side of the first package structure away from the first base substrate — S2032b

FIG. 19

DISPLAY PANEL, METHOD FOR MANUFACTURING DISPLAY PANEL AND DISPLAY DEVICE

TECHNICAL FIELD

The present disclosure relates to the field of display technology, and in particular, to a display panel, a method for manufacturing a display panel and a display device.

BACKGROUND

In a quantum dot Organic Light Emitting Diode (QD-OLED) incorporating a quantum dot (QD) color filter and an Organic Light Emitting Diode (OLED), since a photolumi-nescence spectrum of a QD material has a relatively narrow half-peak width, a QD-OLED display device (i.e., a display device including the QD-OLED) has technical advantages of high color gamut and high color purity, and is independent of viewing angle.

However, since an package structure for packaging the OLED is often disposed between the OLED and a color control unit, a certain distance (generally greater than 10 μm) exists between the OLED and the color control unit opposite thereto, and in such case, light emitted from the OLED may irradiate not only the color control unit opposite to the OLED but also other color control units around the color control unit opposite to the OLED, thereby causing a problem of brightness interference.

SUMMARY

In a first aspect, an embodiment of the present disclosure provides a display panel, including:

a first base substrate;

a light-emitting unit array and a color control unit array, the color control unit array being located on a side of the light-emitting unit array away from the first base substrate, and color control units in the color control unit array correspond to light-emitting units in the light-emitting unit array one to one;

at least part of the light-emitting units are provided with diaphragm (stop) structures corresponding to the at least part of the light-emitting units one to one, the diaphragm structures being located between the light-emitting units and the color control units, and each diaphragm structure being provided with a light passing portion therein;

an orthographic projection of the light passing portion on the first base substrate is overlapped with an ortho-graphic projection of the light-emitting unit, corre-sponding to the light passing portion, on the first base substrate, and an area of the orthographic projection of the light passing portion on the first base substrate is smaller than an area of the orthographic projection of the light-emitting unit, corresponding to the light pass-ing portion, on the first base substrate;

each of the diaphragm structures is configured to block light emitted by the light-emitting unit corresponding thereto and directed to the color control units not corresponding to the light-emitting unit, and to allow part of light emitted by the light-emitting unit and directed to the color control unit corresponding to the light-emitting unit to be transmitted at the light passing portion corresponding to the light-emitting unit.

In some implementations, the orthogonal projection of the light passing portion on the first base substrate is located within the orthogonal projection of the light-emitting unit, corresponding to the light passing portion, on the first base substrate.

In some implementations, each of the diaphragm struc-tures is configured to block light emitted by the light-emitting unit corresponding thereto, directed to the color control units not corresponding to the light-emitting unit, and having an emergent angle smaller than or equal to a preset angle, the emergent angle of the light is an included angle formed by the light and a normal of the first base substrate;

at least one dielectric layer is provided between the diaphragm structures and the light-emitting units cor-responding thereto;

a distance s between a first edge of the orthographic projection of the light passing portion on the first base substrate and a second edge, adjacent to the first edge, of the orthographic projection of the light-emitting unit, corresponding to the light passing portion, on the first base substrate satisfies the following conditions:

$$s=L2-L1;$$

where L1 is a spacing between any two adjacent light-emitting units, and L2 is an offset of the light emitted by the light-emitting unit and having the emergent angle equal to the preset angle when the light reaches a layer structure where the diaphragm structure is located;

$$L2 = \sum_{i=1}^{M} d_i^* \tan\ \theta_i, \quad \theta_i = \arcsin\left(\frac{N_1^* \sin\ \theta_1}{N_i}\right),$$

M is the number of dielectric layers between the diaphragm structures and the light-emitting units corresponding to the diaphragm structures, $d_i$ is a thickness of the $i^{th}$ dielectric layer which is located between the diaphragm structures and the light-emitting unit corresponding to the diaphragm struc-tures and is close to the light-emitting units, and $\theta_i$ is an included angle formed between a direction in which the light emitted by the light-emitting unit and having the emergent angle equal to the preset angle is propagated when the light reaches inside of the $i^{th}$ dielectric layer and the normal of the first base substrate, and $\theta_i$ is equal to the preset angle, and $N_i$ is a refractive index of the $i^{th}$ dielectric layer.

In some implementations, the orthographic projection of the light passing portion on the first base substrate and the orthographic projection of the light-emitting unit, corre-sponding to the light passing portion, on the first base substrate are the same in shape and having center points coincide with each other.

In some implementations, the orthographic projection of the light passing portion on the first base substrate and an orthographic projection of the color control unit, corre-sponding to the light passing portion, on the first base substrate are the same in shape and having center points coincide with each other.

In some implementations, the display panel further includes:

a first package structure located between the light-emit-ting unit array and the color control unit array, the first package structure being configured to package the light-emitting unit array;

the color control units are in contact with the first package structure.

In some implementations, the display panel further includes:

a first package structure located between the light-emitting unit array and the color control unit array, the first package structure being configured to package the light-emitting unit array;

a second package structure and a filling layer located between at least part of the color control units in the color control unit array and the first package structure, the filling layer being located between the second package structure and the first package structure, and the second package structure being configured to package the at least part of the color control units.

In some implementations, the diaphragm structures are embedded in the first package structure.

In some implementations, the first package structure includes:

a first inorganic package layer; and an organic package layer located on a side of the first inorganic package layer away from the first base substrate and being in contact with the first inorganic package layer, the diaphragm structures are located between the first inorganic package layer and the organic package layer.

In some implementations, the diaphragm structures are located between the first package structure and the color control unit array.

In some implementations, the diaphragm structures are in contact with the color control units.

In some implementations, the diaphragm structures are located between the first package structure and the color control unit array.

In some implementations, the diaphragm structures are located between the first package structure and the filling layer, and the diaphragm structures are in contact with the filling layer.

In some implementations, the display panel further includes:

a second package structure, which is at least partially located on a side of the color control units away from the first base substrate, the second package structure being configured to package at least part of the color control units in the color control unit array;

a color filter pattern array located on a side of the second package structure away from the first base substrate, and color filter patterns in the color filter pattern array correspond to the color control units in the color control unit array one to one; and a third package structure located on a side of the color filter pattern array away from the first base substrate, and being configured to package the color filter pattern array.

In some implementations, an orthographic projection of each color control unit on the first base substrate is located within a region covered by the orthographic projection of the light passing portion, corresponding to the color control unit, on the first base substrate.

In some implementations, the display panel further includes:

a color filter pattern array located on a side of the color control unit array away from the first base substrate, and color filter patterns in the color filter pattern array correspond to the color control units in the color control unit array one to one; and a second base substrate located on a side of the color filter pattern array away from the first base substrate.

In some implementations, the orthogonal projection of the light passing portion on the first base substrate is located within an orthogonal projection of the color control unit, corresponding to the light passing portion, on the first base substrate.

In some implementations, the orthogonal projection of each light-emitting unit on the first base substrate is located within the orthogonal projection of the color control unit, corresponding to the light-emitting unit, on the first base substrate.

In some implementations, the preset angle is equal to or less than 60°.

In some implementations, an optical density of a portion of the diaphragm structure outside a region where the light passing portion is located is greater than 1.

In some implementations, the display panel further includes:

a second pixel defining layer provided with a second pixel accommodating hole array, second pixel accommodating holes in the second pixel accommodating hole array correspond to the color control units in the color control unit array one to one, and the color control units in the color control unit array are located in the second pixel accommodating holes corresponding the color control units, the second pixel defining layer has a thickness three times a thickness of the diaphragm structure or more.

In some implementations, a slope angle of each side wall of each diaphragm structure enclosing the light passing portion ranges from about 30° to about 90°.

In some implementations, the slope angle of each side wall of each diaphragm structure enclosing the light passing portion ranges from about 60° to about 90°.

In some implementations, a material of the diaphragm structure includes a resin material having a light-blocking function.

In some implementations, each light-emitting unit emits light of a preset color;

each color control unit in the color control unit array is selected from a color conversion unit or a light transmission unit, the color conversion unit being configured to convert the light of the preset color into light of another color; and the light transmission unit is configured to transmit the light of the preset color.

In some implementations, a material of the color conversion unit includes a quantum dot material;

a material of the light transmission unit includes a transparent resin and scattering particles distributed in the transparent resin.

In some implementations, in response to that the display panel includes the second package structure, the color control units packaged by the second package structure includes at least color conversion units.

In some implementations, the display panel further includes:

a first pixel definiting layer provided with a first pixel accommodating hole array, first pixel accommodating holes in the first pixel accommodating hole array correspond to the light-emitting units in the light-emitting unit array one to one, and the light-emitting units are located in the first pixel accommodating holes corresponding to the light-emitting units.

In some implementations, the display panel includes a diaphragm layer, the diaphragm layer including a plurality of diaphragm structures corresponding to the light-emitting units one to one, and the light passing portion in each diaphragm structure is a light-transmitting hole;

an orthographic projection of the diaphragm layer on the first base substrate fully covers an orthographic projection of the first pixel defining layer on the first base substrate, and an area of the orthographic projection of the diaphragm layer on the first base substrate is larger than an area of the orthographic projection of the first pixel defining layer on the first base substrate.

In a second aspect, an embodiment of the present disclosure further provides a display device including the display panel as provided in the first aspect.

In a third aspect, an embodiment of the present disclosure further provides a method for manufacturing the display panel as provided in the first aspect, including:

forming a light-emitting unit array on a first base substrate;

forming diaphragm structures, configured for at least part of the light-emitting units, on a side of the light-emitting unit array away from the first base substrate, each diaphragm structure is provided with a light passing portion therein, an orthographic projection of the light passing portion on the first base substrate overlaps with an orthographic projection of the light-emitting unit, corresponding to the light passing portion, on the first base substrate, and an area of the orthographic projection of the light passing portion on the first base substrate is smaller than an area of the orthographic projection of the light-emitting unit, corresponding to the light passing portion, on the first base substrate;

forming a color control unit array on a side of the diaphragm structures away from the first base substrate, color control units in the color control unit array corresponding to light-emitting units in the light-emitting unit array one to one, each diaphragm structure is configured to block light emitted by the light-emitting unit corresponding thereto and directed to the color control units not corresponding to the light-emitting unit, and to allow part of light emitted by the light-emitting unit and directed to the color control unit corresponding to the light-emitting unit to be transmitted at the light passing portion corresponding to the light-emitting unit.

In some implementations, the method further includes:

forming a first package structure between forming the light-emitting unit array and forming the color control unit array, forming the first package structure and forming the diaphragm structures includes:

forming a first inorganic package layer on a side of the light-emitting unit array, away from the first base substrate;

forming the diaphragm structures on a side of the first inorganic package layer away from the first base substrate; and forming an organic package layer on a side of the diaphragm structures away from the first base substrate.

In some implementations, forming the diaphragm structures includes:

performing surface treatment on a surface of the first inorganic package layer away from the first base substrate, so that the surface of the first inorganic package layer away from the first base substrate is lyophilic in a region where the diaphragm structures are to be formed, and/or the surface of the first inorganic package layer away from the first base substrate is lyophobic in a region where light passing portions are to be formed;

forming a resin material with a light-blocking function in the region where the diaphragm structures are to be formed by an ink-jet printing process in a nitrogen atmosphere;

and curing the resin material to obtain the diaphragm structures.

In some implementations, the method further includes:

after forming the light-emitting unit array, forming a first package structure;

forming the diaphragm structures includes:

forming the diaphragm structures on a side of the first package structure away from the first base substrate through an ink-jet printing process or a photolithography process.

In some implementations, the method includes:

forming a first display substrate, including forming the light-emitting unit array on the first base substrate and forming the diaphragm structures on the side of the light-emitting unit array away from the first base substrate;

forming a second display substrate, including forming the color control unit array on the second base substrate; and aligning and assembling the first display substrate and the second display substrate to form the display panel, so that the light-emitting unit array, the diaphragm structures and the color control unit array are located between the first base substrate and the second base substrate.

DRAWINGS

FIG. 14 is a flowchart of a method for manufacturing a display panel according to an embodiment of the present disclosure;

FIG. 15 is a schematic cross-sectional diagram illustrating an intermediate structure of the display panel obtained after step S201;

FIG. 18 is a flowchart of an alternative implementation of step S203 in the present disclosure;

FIG. 19 is a flowchart of another alternative implementation of step S203 in the present disclosure;

DETAILED DESCRIPTION

In order to make those skilled in the art better understand the technical solutions of the present disclosure, a display panel, a method for manufacturing the display panel, and a display device provided by the present disclosure will be described in detail below with reference to the accompanying drawings.

To make objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are part of embodiments of the present disclosure, not all of them. The embodiments in the present disclosure and the features in the embodiments may be combined with each other without conflict. Based on the described embodiments of the present disclosure, all other embodiments obtained by those skilled in the art without creative effort fall within the protection scope of the present disclosure.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. The word "comprise/comprising", "includes/including", or the like means that the element or item preceding the word includes the element or item listed after the word and its equivalent, but does not exclude other elements or items. The word "connected/connecting", "coupled/coupling" or the like are not restricted to physical or mechanical connections, but may include electrical connections, whether direct or indirect.

Figures 1, 2:
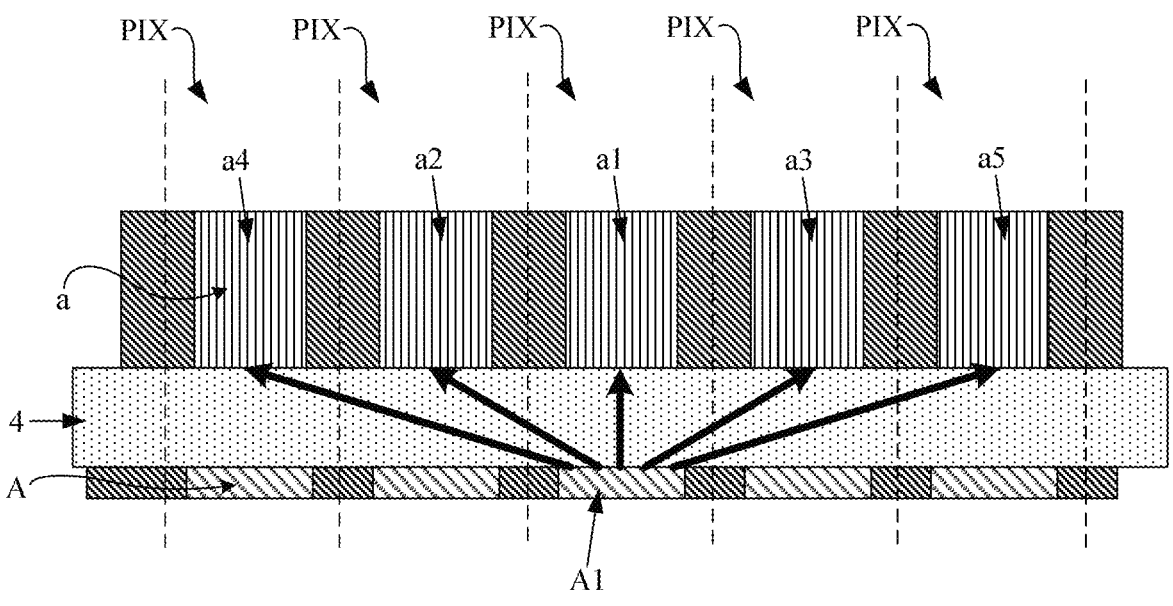
FIG. 1 is a schematic cross-sectional diagram of a display panel in the related art.
FIG. 2 is a schematic cross-sectional diagram of a partial area of a display panel according to an embodiment of the present disclosure.

FIG. 1 is a schematic cross-sectional diagram of a display panel in the related art, and as shown in FIG. 1, the display panel is divided into a plurality of sub-pixel regions PIX, each sub-pixel region PIX is provided therein with a color control unit a and a light-emitting unit A corresponding to the color control unit a, and a package structure 4 is provided between the color control unit a and the light-emitting unit A corresponding to the color control unit a, so that a certain distance exists between the color control unit a and the light-emitting unit A corresponding to the color control unit a. Since light emitted from the light-emitting unit A is scattered light, a part of the light emitted from the light-emitting unit A (referred to as "effective light") may irradiate to the color control unit a corresponding to the light-emitting unit A, and a part of the light (referred to as "interference light") may irradiate to other color control units a located around the color control unit a corresponding to the light-emitting unit A.

Taking a case shown in FIG. 1 as an example, the light emitted by the light-emitting unit A1 may not only irradiate to the color control unit a1 corresponding to the light-emitting unit A1, but also irradiate to other color control units a2, a3, a4 and a5, and in particular, the color control units a2 and a3 adjacent to the color control unit a1 may receive relatively strong interference light, that is, the light-emitting unit A1 causes serious interference to brightness in regions where the color control units a2 and a3 are located.

Based on the above description, it can be seen that the display panel provided by the related art has a problem of brightness interference occuring between different sub-pixel regions, and the brightness interference between adjacent sub-pixel regions is particularly serious.

In order to effectively solve the problem in the related art that light emitted by the light-emitting unit is irradiated to the color control units not corresponding to the light-emitting unit to cause brightness interference between sub-pixel regions, the present disclosure provides a corresponding solution.

FIG. 2 is a schematic cross-sectional diagram of a partial area of a display panel provided in an embodiment of the present disclosure, as shown in FIG. 2, the display panel is divided into a plurality of sub-pixel regions arranged in an array, and the display panel includes a first base substrate 1, a light-emitting unit array (i.e., an array of light-emitting units) 2, and a color control unit array (i.e., an array of color control units) 3.

The first base substrate 1 may be a suitable substrate such as a hard substrate (e.g., a glass substrate) or a flexible substrate (e.g., a resin substrate).

The color control unit array 3 is located on a side of the light-emitting unit array 2 away from the first base substrate 1, the color control unit array 3 includes a plurality of color control units 3r, 3g, 3b corresponding to the sub-pixel regions one to one, and the light-emitting unit array 2 includes a plurality of light-emitting units 2a corresponding to the sub-pixel regions one to one; each sub-pixel region is provided therein with one of the light-emitting units 2a and one of the color control units 3r, 3g, 3b, and the one of the light-emitting units 2a and the one of the color control units 3r, 3g and 3b located in a same sub-pixel region are arranged correspondingly and oppositely.

The display panel further includes diaphragm structures 5 configured for at least part of the light-emitting units, each diaphragm structure 5 is located between the light-emitting unit and the color control unit corresponding to the diaphragm structure 5, and a light passing portion 5a is formed in each diaphragm structure 5. That is, for each sub-pixel region provided with the diaphragm structure 5, one of the light-emitting units 2a, one of the color control units 3r, 3g, 3b, and one light passing portion 5a are disposed therein, and the light passing portion 5a is located between the one of the light-emitting units 2a and the one of the color control units 3r, 3g, 3b corresponding to the light passing portion 5a.

An orthographic projection of the light passing portion 5a on the first base substrate 1 overlaps with an orthographic projection of the light-emitting unit 2a, corresponding to the light passing portion 5a, on the first base substrate 1, and an area of the orthographic projection of the light passing portion 5a on the first base substrate 1 is smaller than an area of the orthographic projection of the light-emitting unit 2a, corresponding to the light passing portion 5a, on the first base substrate 1.

The diaphragm structure 5 is configured to block a portion of light emitted by the light-emitting unit 2a and directed to the color control unit not corresponding to the light-emitting unit 2a, and to allow a part of light emitted by the light-emitting unit 2a and directed to the color control unit corresponding to the light-emitting unit 2a to be transmitted at the light-transmitting unit 5a corresponding to the light-emitting unit 2a.

In the embodiment of the present disclosure, by providing respective diaphragm structures 5 between at least part of the light-emitting units 2a and the color control units corresponding to the light-emitting units 2a, the diaphragm structures 5 allow a portion of the light emitted by the light-emitting units 2a and directed to the color control units 3r, 3g, and 3b corresponding to the light-emitting units 2a to be transmitted at light passing portions 5a corresponding to the light-emitting units 2a, so as to ensure that at least part of the light emitted by the light-emitting units 2a can reach the color control units 3r, 3g, 3b corresponding to the light-emitting units 2a, thereby ensuring that each sub-pixel region can normally display, meanwhile, the diaphragm structures 5 block a part of the light emitted by the light-emitting units 2a and directed to the color control units 3r, 3g, 3b not corresponding to the light-emitting units 2a, and thus the problem of brightness interference occuring between different sub-pixel regions in the related art can be effectively solved.

Referring to FIG. 2, in some implementations, each light-emitting unit 2a is configured with the diaphragm structure 5 corresponding thereto, which can fully solve the problem of brightness interference occuring between sub-pixel regions of the display panel. It should be noted that FIG. 2 only illustrates a case where all the light-emitting units 2a are configured with the diaphragm structures 5 corresponding thereto (i.e., each light-emitting unit is configured with the light-emitting unit 5a corresponding thereto), but such case is only for exemplary purposes, and does not limit the technical solution of the present disclosure.

Based on the aforementioned principle, it can be seen that, in the present disclosure, by configuring corresponding diaphragm structures for the light-emitting units, the brightness interference of the light-emitting units to other sub-pixel regions around the light-emitting units can be effectively relieved; that is, in the present disclosure, as long as a part of the light-emitting units are configured with the diaphragm structures corresponding thereto, the problem of brightness interference occuring between different sub-pixel regions in the related art can be relieved to some extent.

In the embodiment of the present disclosure, the light-emitting unit 2a may be an OLED, a Light Emitting Diode (LED), a Micro-LED (Micro-LED), a Mini-LED (Mini-LED), or the like.

In some implementations, each of the color control units 3r, 3g, 3b in the color control unit array 3 may be selected from a color conversion unit or a light transmission unit, the color conversion unit is configured to convert light of a preset color into light of another color, and the light transmission unit is configured to transmit the light of the preset color.

In some implementations, a material of the color conversion unit includes a quantum dot material; a material of the light transmission unit includes a transparent resin and scattering particles distributed in the transparent resin.

As an example, the light-emitting unit 2a is a blue OLED, the color control units in the color control unit array 3 may include a red color conversion unit 3r (the sub-pixel region corresponding thereto is a red sub-pixel region), a green color conversion unit 3g (the sub-pixel region corresponding thereto is a green sub-pixel region), and a blue light transmission unit 3b (the sub-pixel region corresponding thereto is a blue sub-pixel region), the red color conversion unit 3r can convert blue light emitted by the blue OLED into red light, the green color conversion unit 3g can convert blue light emitted by the blue OLED into green light, and the blue light transmission unit 3b is filled with scattering particles (e.g., scattering particles made of titanium oxide) capable of transmitting and scattering the blue light emitted by the blue OLED. Based on the above arrangement, color display of the display panel can be realized.

In some implementations, the diaphragm structure 5 is configured to block a portion of light emitted by the light-emitting unit 2a, directed to the color control units not corresponding to the light-emitting unit 2a, and having an emergent angle smaller than or equal to a preset angle, so as to ensure that the portion of light emitted by the light-emitting unit 2a and having the emergent angle smaller than or equal to the preset angle cannot reach the color control units 3r, 3g, 3b not corresponding to the light-emitting unit 2a, where the emergent angle of the light is an included angle formed between the light and a normal of the first base substrate.

Figure 3:
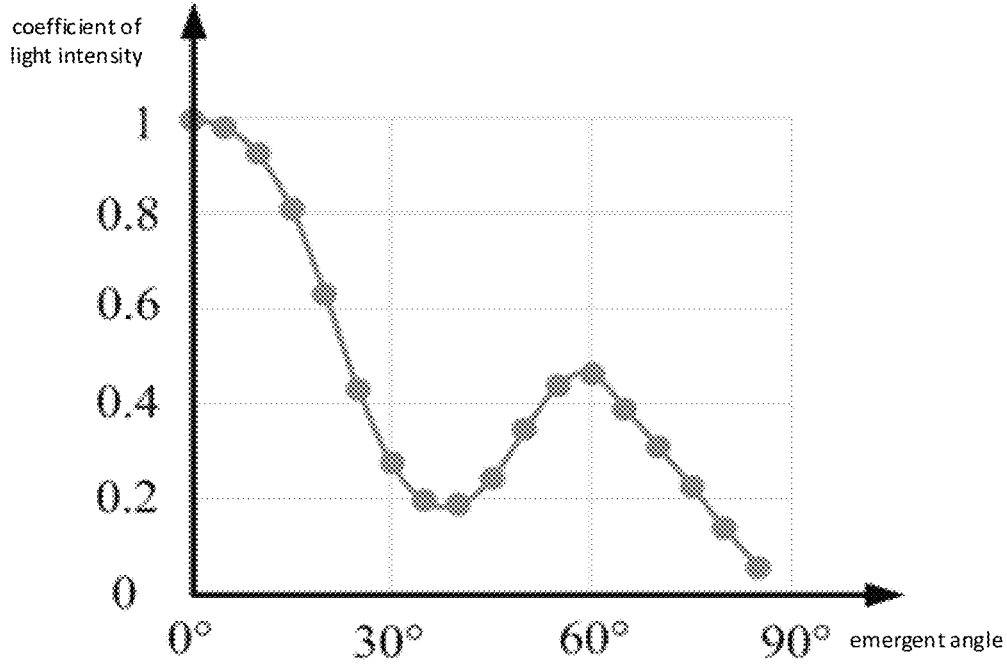
FIG. 3 is a schematic diagram illustrating a distribution of light fields of a light-emitting unit according to an embodiment of the present disclosure.

FIG. 3 is a schematic diagram illustrating a distribution of light fields of the light-emitting unit in an embodiment of the present disclosure, as shown in FIG. 3, a horizontal axis represents the emergent angle of light, and a vertical axis represents a coefficient of light intensity, where the greater the light intensity is, the greater the coefficient corresponding the light intensity is, and the coefficient of the light intensity of the light having the emergent angle of 0° is represented as "1".

As can be seen from FIG. 3, in a range from 0° to x1°, the coefficient of the light intensity gradually decreases as the emergent angle of light increasing; in a range from x1° to x2°, the coefficient of the light intensity gradually increases as the emergent angle of light increasing; in a range from x2° to 90°, the coefficient of the light intensity gradually decreases as the emergent angle of light increasing. A value of x1° is about 40°, and a value of x2° is about 60°.

Figure 4:
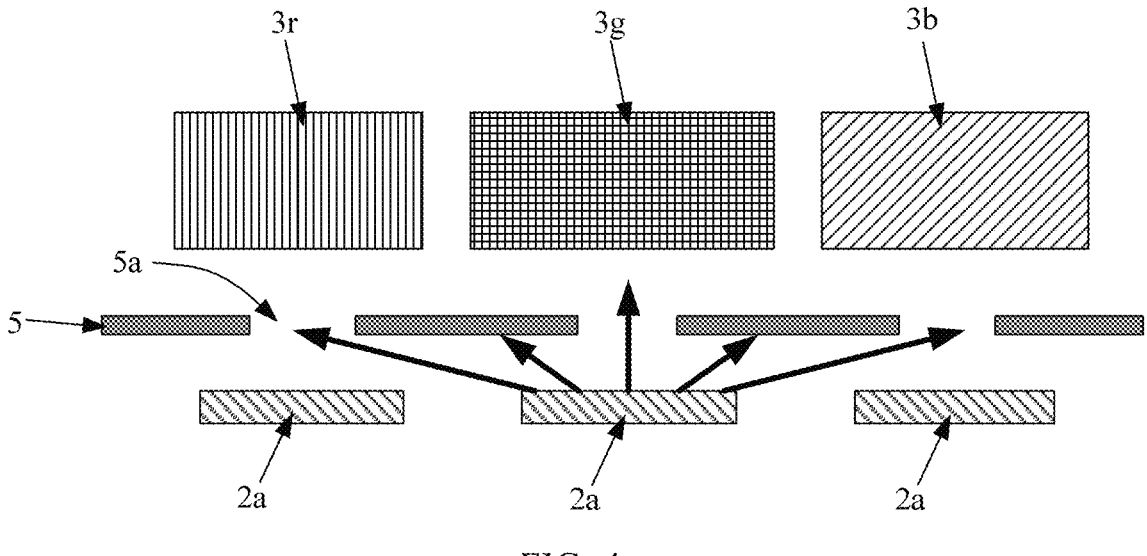
FIG. 4 is a schematic cross-sectional diagram of a light-emitting unit array, a diaphragm structure, and a color control unit array according to an embodiment of the present disclosure.

FIG. 4 is a schematic cross-sectional diagram of the light-emitting unit array, the diaphragm structures and the color control unit array in the present disclosure, as shown in FIG. 4, since the light-emitting unit 2a emits light in any direction at a light-emitting side thereof (the emergent angle of the light emitted ranges from 0° to 90°), when there is a certain distance between the diaphragm structure 5 and the light-emitting unit 2a, a part of light emitted by the light-emitting unit 2a and having a relatively large emergent angle may always transmit through the light-transmitting units 5a not corresponding to the light-emitting unit 2a, and thus brightness interference to the sub-pixel regions where the light-transmitting units 5a not corresponding to the light-emitting unit 2a are located occurs.

As can be seen from FIG. 3, the light with a relatively small emergent angle has a relatively high brightness, and the light with a relatively large emergent angle has a relatively low brightness, so that, in order to reduce the brightness interference of the light-emitting unit 2a to other sub-pixel regions as much as possible, the light emitted from the light-emitting unit 2a and having the relatively small emergent angle should be prevented from reaching the color control units not corresponding to the light-emitting unit 2a (the light that can transmit through the light passing portions 5a not corresponding to the light-emitting unit 2a is desired to be the light having the relatively large emergent angle as much as possible). Based on such situation, a value of the "preset angle" may be preset as desired, the emergent angle with a value larger than the value of the preset angle may be regarded as a relatively large emergent angle, and the emergent angle with a value smaller than or equal to the value of the preset angle may be regarded as a relatively small emergent angle. In some implementations, the preset angle is equal to or less than about 60°, for example the value of the preset angle is about 40° or about 60°.

It should be noted that, the smaller the value of the preset angle is, the smaller the line width of the diaphragm structure 5 is, and in such case, the more serious the brightness interference of the light-emitting unit 2a to the sub-pixel regions not corresponding to the light-emitting unit 2a is. The larger the value of the preset angle is, the larger the line width of the diaphragm structure 5 is, and in such case, the more the diaphragm structure 5 blocks the light-emitting unit 2a corresponding thereto (the smaller the size of the light passing portion 5a is), the less the light emitted by the light-emitting unit 2a and capable of reaching the color control units 3r, 3g, or 3b is, and the smaller the rate that the light emitted by the light-emitting unit 2a is utilized is. In practical applications, the value of the "preset angle" may be set according to two factors, namely, a degree of the brightness interference and the rate that the light emitted by the light-emitting unit 2a is utilized.

In some implementations, an optical density (OD) of a portion of the diaphragm structure 5 outside the region where the light passing portion 5a is located is greater than 1, so as to ensure an effect that the portion of the diaphragm structure 5 outside the region where the light passing portion 5a is located blocks light.

In some implementations, a material of the diaphragm structure 5 includes a resin material having a function of blocking light.

In some implementations, each side wall of each diaphragm structure 5 enclosing the light passing portion 5a has a slope angle ranging from about 30° to about 90°. In some implementations, each side wall of each diaphragm structure 5 enclosing the light passing portion 5a has a slope angle ranging from about 60° to about 90°. In a case where a thickness of the diaphragm structure 5 is constant, the smaller the slope angle of each side wall of each diaphragm structure 5 enclosing the light-transmitting unit 5a is, the larger the area of a region where a thickness of a portion of the side wall is relatively thin is, and the poorer the overall effect that the side wall blocks the light is (the smaller the value of the OD is). Therefore, in practical applications, the slope angle of each side wall of each diaphragm structure 5 should be as large as possible, and for example, is about 90°.

Figure 5:
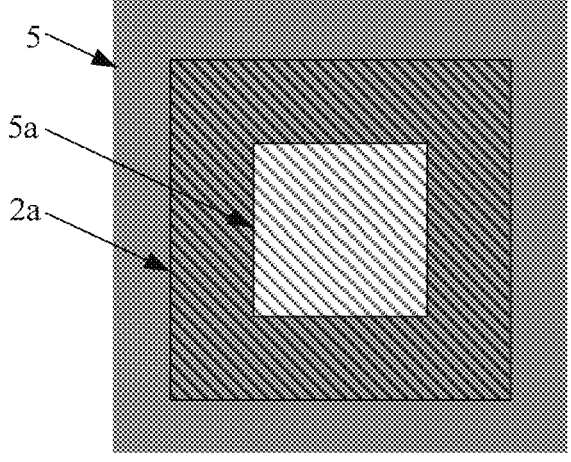
FIG. 5 is a schematic top diagram of a light-emitting unit and a light passing portion corresponding to the light-emitting unit according to an embodiment of the present disclosure.

FIG. 5 is a schematic top diagram of the light-emitting unit and the light passing portion corresponding to the light-emitting unit in an embodiment of the present disclosure, as shown in FIG. 5, in some implementations, an orthographic projection of the light passing portion 5a on the first base substrate 1 is located within an orthographic projection of the light-emitting unit 2a corresponding to the light passing portion 5a on the first base substrate 1. That is, the light passing portion 5a is disposed directly opposite to the light-emitting unit 2a corresponding thereto.

In a case where the light passing portion 5a is disposed directly opposite to the light-emitting unit 2a corresponding thereto, most of light emitted by the light-emitting unit 2a towards the color control unit corresponding to the light-emitting unit 2a by transmitting through the light passing portion 5a is light with a relatively small emergent angle; based on the diagram shown in FIG. 3 illustrating the distribution of light fields of the light-emitting unit 2a, the intensity of the light with the relatively small emergent angle is relatively high, which is beneficial to improving the rate that the light emitted by the light-emitting unit 2a is utilized.

The orthographic projection of the light-emitting unit on the first base substrate is located in an orthographic projection of the color control unit, corresponding to the light-emitting unit, on the first base substrate.

In some implementations, the orthogonal projection of the light passing portion 5a on the first base substrate 1 and the orthogonal projection of the light-emitting unit 2a, corresponding to the light passing portion 5a, on the first base substrate 1 are the same in shape, and have center points coincide with each other.

Figure 6:
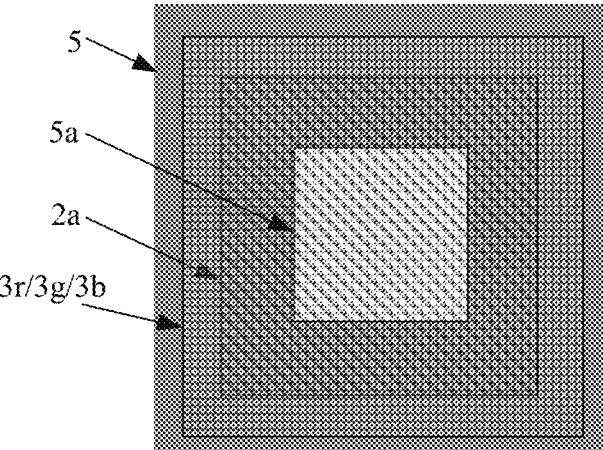
FIG. 6 is a schematic top diagram of a light-emitting unit, and a light passing portion and a color control unit corresponding to the light-emitting unit according to an embodiment of the present disclosure.

FIG. 6 is a schematic top diagram of the light-emitting unit and the light passing portion and the color control unit corresponding to the light-emitting unit in an embodiment of the present disclosure, as shown in FIG. 6, in some implementations, the orthographic projection of the light-emitting unit 2a on the first base substrate 1 is located within an orthographic projection of the color control unit 3r, 3g or 3b, corresponding to the light-emitting unit 2a, on the first base substrate 1, and the orthographic projection of the light passing portion 5a on the first base substrate 1 is located within the orthographic projection of the light-emitting unit 2a, corresponding to the light passing portion 5a, on the first base substrate 1. That is to say, the light-emitting unit 2a, the light passing portion 5a corresponding to the light-emitting unit 2a, and the color control unit 3r, 3g or 3b corresponding to the light-emitting unit 2a are disposed directly opposite to each other, an area of the orthographic projection of the color control unit on the first base substrate 1 is larger than an area of the orthographic projection of the light passing portion 5a corresponding to the color control unit on the first base substrate 1, and the area of the orthographic projection of the light-emitting unit 2a on the first base substrate 1 is larger than the area of the orthographic projection of the light passing portion 5a, corresponding to the light-emitting unit 2a, on the first base substrate 1.

In some implementations, the orthographic projection of the light passing portion 5a on the first base substrate 1 and the orthographic projection of the color control unit 3r, 3g or 3b, corresponding to the light passing portion 5a, on the first base substrate 1 are the same in shape and have center points coincide with each other.

Furthermore, the orthographic projection of the light passing portion 5a on the first base substrate 1, the orthographic projection of the light-emitting unit 2a, corresponding to the light passing portion 5a, on the first base substrate 1, and the orthographic projection of, the color control unit 3r, 3g or 3b, corresponding to the light passing portion 5a, on the first base substrate 1 are the same in shape and have center points coincide with each other.

In some implementations, the display panel is a display panel in which film layers are sequentially stacked, that is, the light-emitting unit array, the diaphragm structure, and the color control unit array are sequentially formed on the first base substrate. In such case, the display panel further includes a first package structure 4, the first package structure 4 being located between the light-emitting unit array 2 and the color control unit array 3, the first package structure 4 being configured to package the light-emitting unit array 2, the color control unit array 3 is in contact with the first package structure 4, that is, the color control unit array 3 is directly manufactured on the first package structure 4.

With continued reference to FIG. 6, in a case where the display panel is a display panel in which film layers are sequentially stacked, in some implementations, the orthographic projection of each of the color control units 3r, 3g, 3b on the first base substrate 1 completely covers the orthographic projection of the light passing portion 5a, corresponding to said each of the color control units 3r, 3g, 3b, on the first base substrate 1, and is located in a region defined by the orthographic projections of the light-emitting unit 2a, corresponding to said each of the color control units 3r, 3g, 3b, on the first base substrate 1. The area of the orthographic projection of each of the color control units 3r, 3g, 3b on the first base substrate 1 is larger than the area of the orthographic projection of the light passing portion 5a, corresponding to said each of the color control units 3r, 3g, 3b, on the base first base substrate 1, and smaller than the area of the orthographic projection of the light-emitting unit 2a, corresponding to said each of the color control units 3r, 3g, 3b, on the first base substrate 1.

Referring to FIG. 4, in some implementations, a spacing s1 between any two adjacent light-emitting units 2a ranges from about 12 µm to about 14 µm; a spacing s2 between any two adjacent light passing portions 5a ranges from about 33 µm to about 35 µm; a spacing s3 between any two adjacent ones of the color control units 3r, 3g, 3b ranges from about 23 µm to about 25 µm.

With continued reference to FIG. 2, in some implementations, the diaphragm structures 5 are embedded in the first package structure 4.

Figure 7:
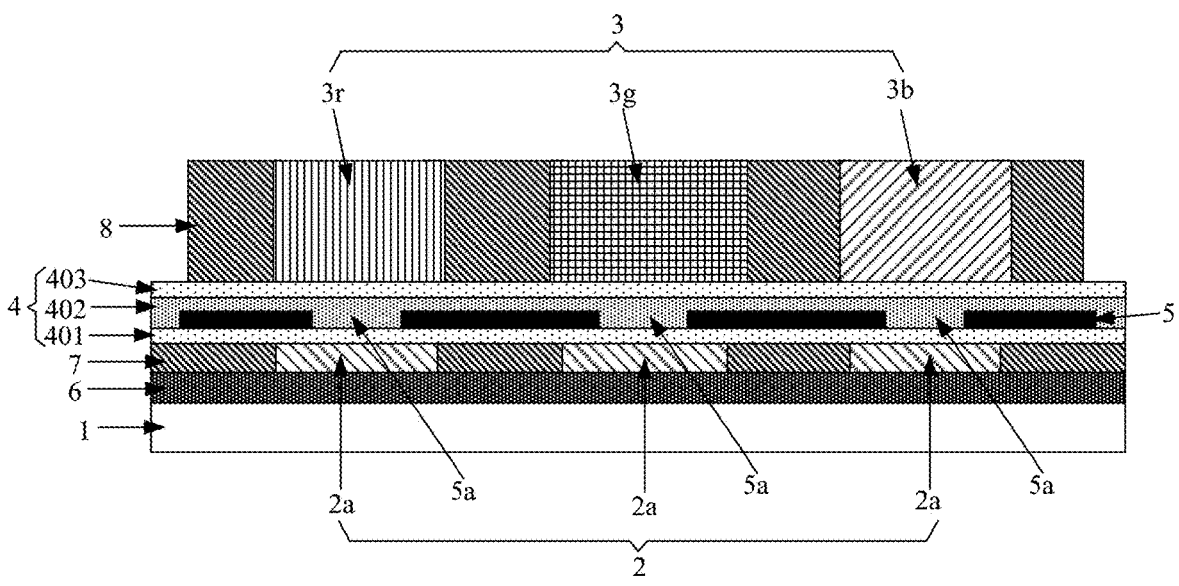
FIG. 7 is a schematic cross-sectional diagram of a partial area of a display panel according to an embodiment of the present disclosure.

FIG. 7 is another schematic cross-sectional diagram of a partial area of a display panel provided in an embodiment of the present disclosure, and FIG. 7 illustrates an implementation in which the diaphragm structures 5 are embedded in the first package structure 4. The first package structure 4 includes a first inorganic package layer 401 and an organic package layer 402 which is located on a side of the first inorganic package layer 401 away from the first base substrate 1 and is in contact with the first inorganic package layer 401. The diaphragm structures 5 are located between the first inorganic package layer 401 and the organic package layer 402.

It should be noted that FIG. 7 only shows one first inorganic package layer 401 and one organic package layer 402 by way of example, which is only for illustrative purposes and does not limit the technical solutions of the present disclosure. In some implementations, one first inorganic package layer 401 and one organic package layer 402 in contact with a surface of the first inorganic package layer 401 away from the first base substrate 1 form one re-package unit, the first package structure 4 includes at least two re-package units stacked along a normal direction of the first base substrate 1, and the diaphragm structures 5 may be located in any one of the re-package units, so as to achieve that the diaphragm structures 5 are embedded in the first package structure 4, which is not shown in the drawings.

In addition, in some implementations, the first package structure 4 further includes a second inorganic package layer 403, and the second inorganic package layer 403 is located at an outermost side of the first package structure 4 and away from the first base substrate 1.

Figure 8:
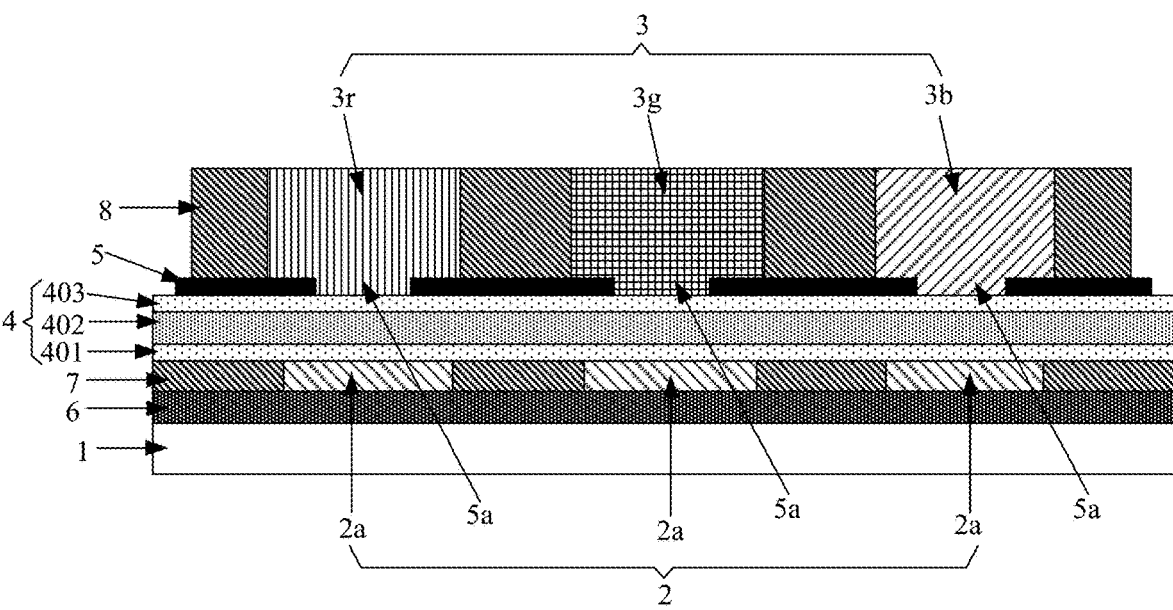
FIG. 8 is a schematic cross-sectional diagram of a partial area of a display panel according to an embodiment of the present disclosure.

FIG. 8 is a schematic cross-sectional diagram of a partial area of a display panel provided in an embodiment of the present disclosure, and as shown in FIG. 8, the display panel is also a display panel in which film layers are sequentially stacked, that is, the color control unit array 3 is in contact with the first package structure 4; however, unlike the case where the diaphragm structures 5 are embedded in the first package structure 4 as shown in FIGS. 2 and 7, FIG. 8 illustrates a case where the diaphragm structures 5 are located between the first package structure 4 and the color control unit array 3.

It should be noted that FIG. 8 illustrates a case where the first package structure 4 includes a first inorganic package layer 401, an organic package layer 402, and a second inorganic package layer 403, which are sequentially stacked, and this case does not limit the technical solutions of the present disclosure. The structure of the first package structure 4 is not limited herein.

In some implementations, each of the first inorganic package layer 401 and the second inorganic package layer 403 may be formed by depositing silicon oxide material and/or silicon nitride material by a Chemical Vapor Deposition (CVD) process, and generally has a thickness ranging from about 0.6 µm to about 1.2 µm. The organic package layer 402 may be formed of an organic material by an Ink Jet Printing (IJP) process, and generally has a thickness ranging from about 6 µm to about 8 µm, and the organic package layer 402 may also play a role of planarization.

With continued reference to FIGS. 2, 7, and 8, in some implementations, the display panel further includes a first pixel defining layer 7 and a second pixel defining layer 8.

The first pixel defining layer 7 has an array of first pixel accommodating holes, the first pixel accommodating holes correspond to the light-emitting units 2a in the light-emitting unit array 2 one to one, and the light-emitting units 2a are located in the first pixel accommodating holes corresponding thereto.

The first pixel defining layer 7 may be made of a transparent resin material or a colored resin material, for example, may be made of the colored resin material, or may be made of a black resin material. The second pixel defining layer 8 (also referred to as a Bank) has an array of second pixel accommodating holes, the second pixel accommodating holes correspond to the color control units 3r, 3g, 3b of the color control unit array 3 one to one, the color control units 3r, 3g, 3b of the color control unit array 3 being located in the second pixel accommodating holes corresponding thereto.

The second pixel defining layer 8 may be made of a light absorbing material (e.g., a black resin material) or a reflective material. In a case where the second pixel defining layer 8 is made of the light absorbing material, although light crosstalk between different sub-pixels may be effectively avoided, the rate that the light is emitted from the sub-pixel regions is relatively low; in a case where the second pixel defining layer 8 is made of the reflective material, although the rate that the light is emitted from the sub-pixel regions can be effectively improved, the direction in which the light is reflected is uncontrollable, and the risk of color crosstalk is increased.

Sizes of the first pixel accommodating holes in the first pixel defining layer 7 and the second pixel accommodating holes in the second pixel defining layer 8, spacings between any two adjacent ones of the first pixel accommodating holes, and spacings between any two adjacent ones of the second pixel accommodating holes are related to sizes of the sub-pixel regions disposed in the display panel, and are not limited herein.

In some implementations, the display panel includes a diaphragm layer, the diaphragm layer includes a plurality of diaphragm structures 5 corresponding to the light-emitting units one to one (i.e., all the diaphragm structures 5 constitute the diaphragm layer), and the light passing portion 5a in each of the diaphragm structures 5 is a light passing hole. An orthographic projection of the diaphragm layer on the first base substrate 1 completely covers an orthographic projection of the first pixel definiting layer 7 on the first base substrate 1, and an area of the orthographic projection of the diaphragm layer on the first base substrate 1 is larger than an area of the orthographic projection of the first pixel definiting layer 7 on the first base substrate 1.

In some implementations, a thickness of the second pixel defining layer 8 is three times the thickness of the diaphragm structure 5 or more. Typically, the thickness of the second pixel defining layer is about 6 μm, therefore, the thickness of the diaphragm structure may be set to be less than or equal to about 2 μm. It should be noted that the thicker the diaphragm structure is, the larger the overall thickness of the display panel is, which is not favorable for lightness and thinness of the product. However, if the thickness of the diaphragm structure is too small, the effect thereof for blocking light may be affacted. In practical applications, the thickness of the diaphragm structure may be designed and adjusted as desired. In some implementations, the thickness of the diaphragm structure ranges from about 1 μm to about 2 μm. In practical applications, the thickness of the diaphragm structure may be designed according to the desired effect for blocking light.

Figure 9A:
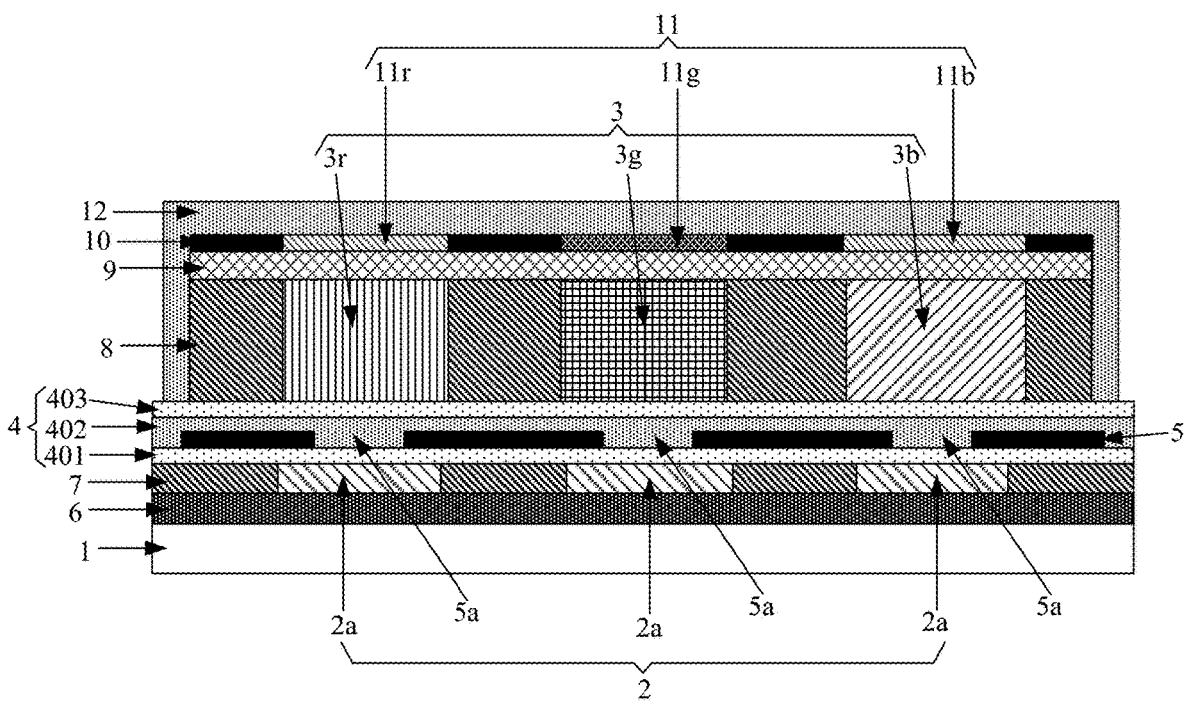
FIG. 9A is a schematic cross-sectional diagram of a partial area of a display panel according to an embodiment of the present disclosure.
Figure 9B:
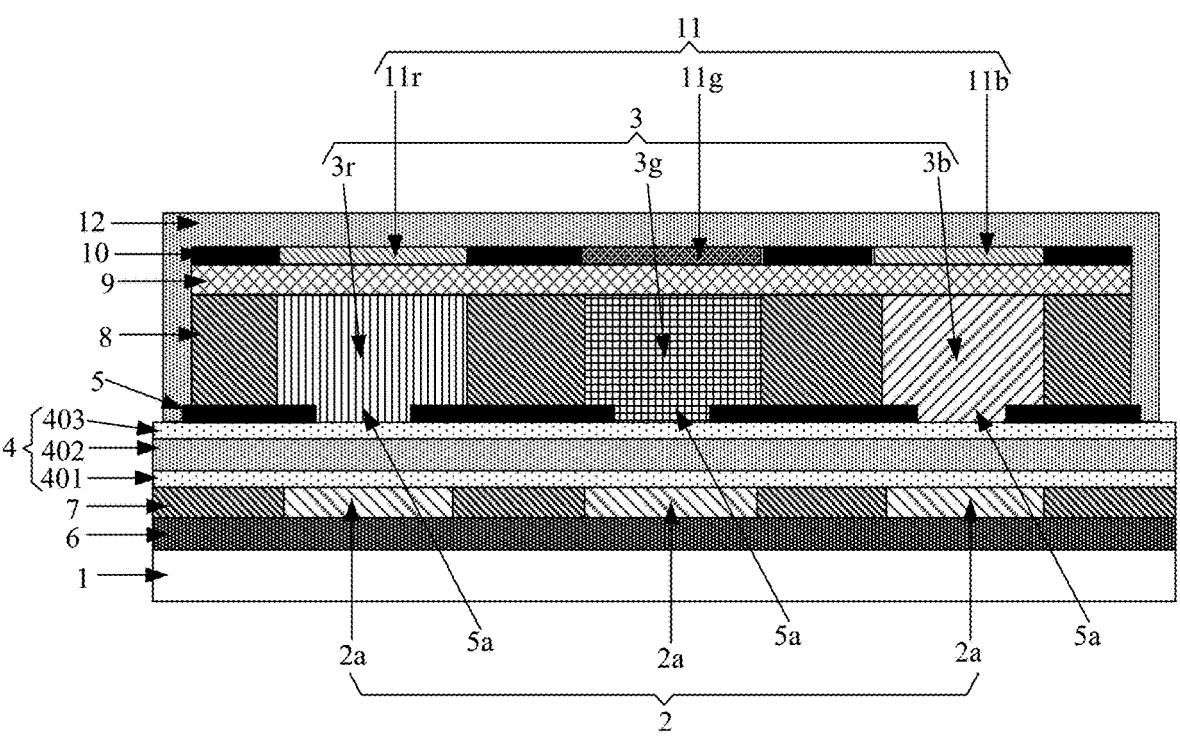
FIG. 9B is a schematic cross-sectional diagram of a partial area of a display panel according to an embodiment of the present disclosure.

FIG. 9A is a schematic cross-sectional diagram of a partial area of a display panel provided in an embodiment of the present disclosure, and FIG. 9B is a schematic cross-sectional diagram of a partial area of a display panel provided in an embodiment of the present disclosure, as shown in FIGS. 9A and 9B, in some implementations, the display panel further includes a second package structure 9, a color filter pattern array (i.e., an array of color filter patterns) 11 and a third package structure 12.

The second package structure 9 is located on a side of the color control unit array 3 away from the first base substrate 1, and the second package structure 9 is configured to package at least part of the color control units in the color control unit array 3. The second package structure 9 adopts a single layer of inorganic material film made of silicon nitride or silicon oxide, or the second package structure 9 adopts a stacked structure of an organic material film and an inorganic material film. The second package structure 9 can prevent external moisture from entering the packaged color control units 3r, 3g, 3b, thereby preventing the external moisture from damaging the performance of the color control units 3r, 3g, 3b.

It should be noted that FIG. 9A only illustrates a case where the second package structure 9 packages all the color control units 3r, 3g, 3b, which is only for exemplary purposes, and does not limit the technical solutions of the present disclosure.

The color filter pattern array 11 is located on a side of the second package structure 9 away from the first base substrate 1, and color filter patterns 11r, 11g, 11b in the color filter pattern array 11 correspond to the color control units 3r, 3g, 3b in the color control unit array 3 one to one. In some implementations, the display panel further includes a black matrix (BM) 10 disposed in the same layer as the color filter pattern array 11. Alternatively, the color control units in the color control unit array 3 may include a red color conversion unit 3r, a green color conversion unit 3g, and a blue light transmission unit 3b, the color filter patterns in the color filter pattern array 11 may include a red color filter pattern 11r (located in a red sub-pixel region) corresponding to the red color conversion unit 3r, a green color filter pattern 11g (located in a green sub-pixel region) corresponding to the green color conversion unit 3g, and a blue color filter pattern 11b (located in a blue sub-pixel region) corresponding to the blue light transmission unit 3b. The color filter patterns 11r, 11g, 11b can filter color of the light emitted from the color control units 3r, 3g, 3b corresponding thereto, so that the sub-pixel regions corresponding thereto have higher light purity and better color saturation, so as to improve the color display effect of the display panel.

The third package structure 12 is located on a side of the color filter pattern array 11 away from the first base substrate 1, and the third package structure 12 is configured to package the color filter pattern array 11. Certainly, the third package structure 12 may be used to package not only the color filter pattern array 11, but also the entire display panel, so as to prevent the film layers inside the display panel from being damaged by external factors. In some implementations, a material of the third package structure 12 may be a low-temperature transparent resin material.

In some implementations, a cover plate (not shown) may be further disposed on a side of the third package structure 12 away from the first base substrate 1, and the cover plate may protect the entire display panel to some extent.

Figure 9C:
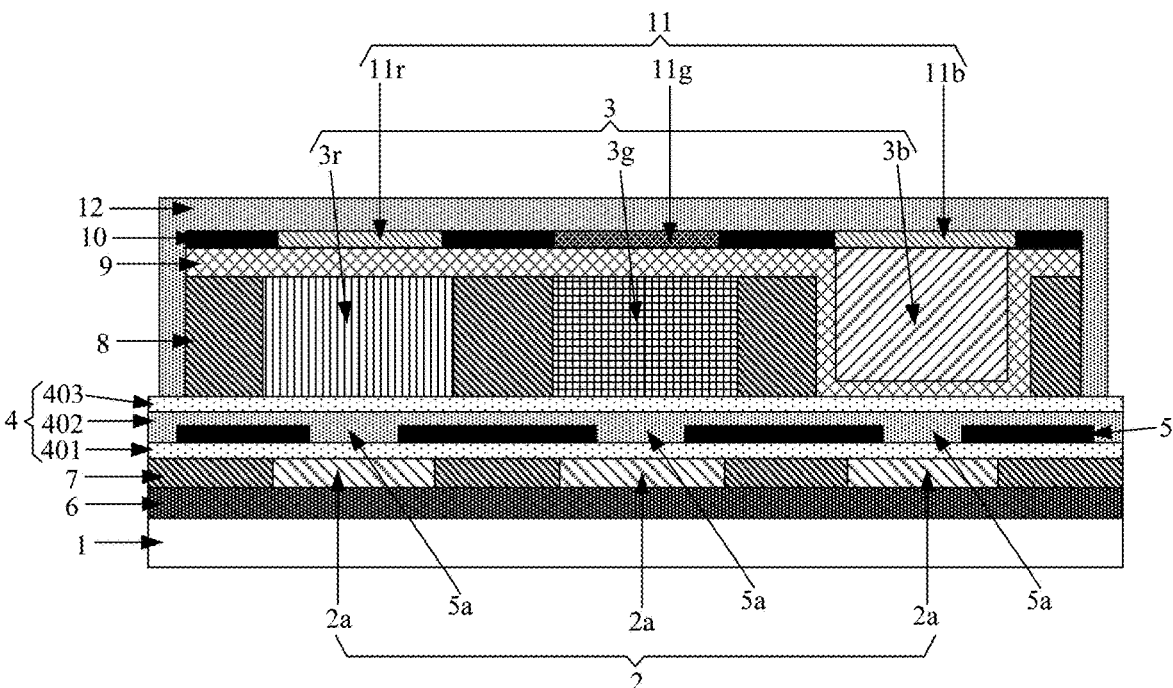
FIG. 9C is a schematic cross-sectional diagram of a partial area of a display panel according to an embodiment of the present disclosure.
Figure 9D:
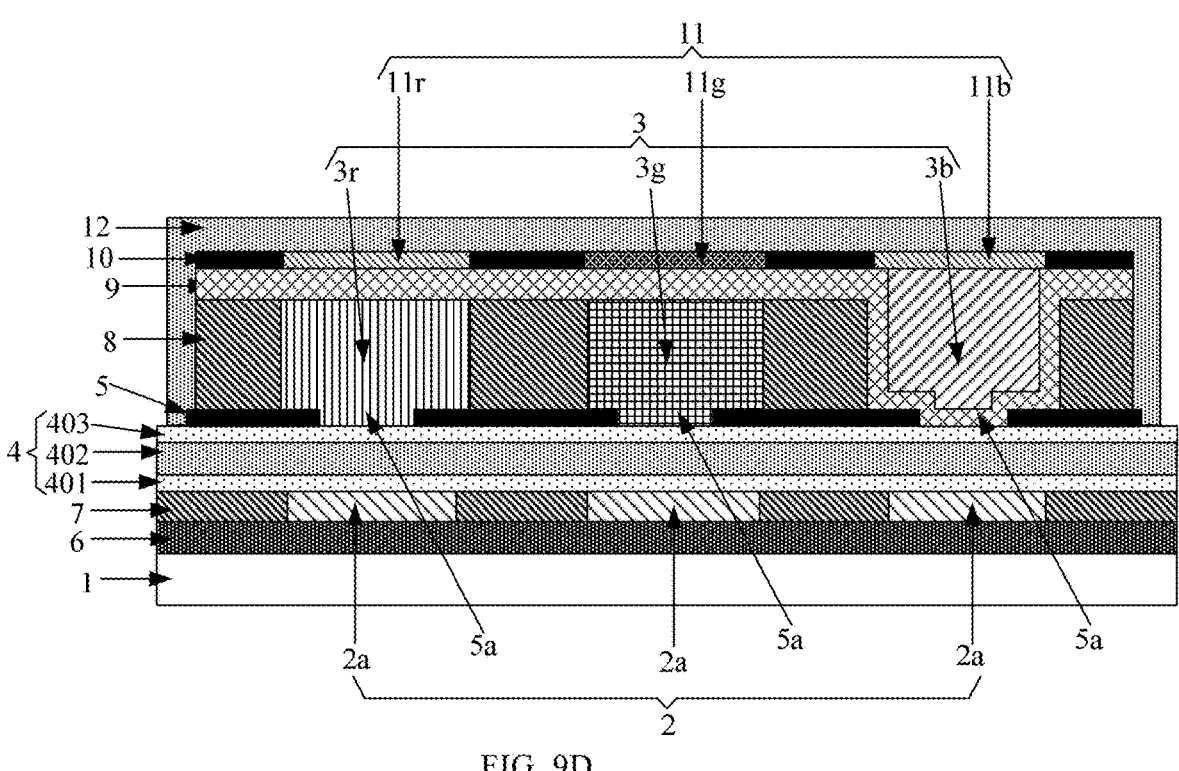
FIG. 9D is a schematic cross-sectional diagram of a partial area of a display panel according to an embodiment of the present disclosure.

FIG. 9C is a further schematic cross-sectional diagram of a partial area of the display panel provided in an embodiment of the present disclosure, FIG. 9D is a further schematic cross-sectional diagram of a partial area of the display panel provided in an embodiment of the present disclosure, and as shown in FIGS. 9C and 9D, unlike the case where the second package structure 9 package all the red color conversion unit 3r, the green color conversion unit 3g, and the blue light transmission unit 3b as shown in FIGS. 9A and 9B, FIGS. 9C and 9D shows a case where the second package structure 9 only package the color conversion units, that is, the red color conversion unit 3r and the green color conversion unit 3g, but does not package the blue light transmission unit 3b.

In practical applications, at least a part of the color control units in the color control unit array may be selectively packaged by the second package structure 9, which is not described herein by way of example.

FIG. 10A is a schematic cross-sectional diagram of a partial area of the display panel provided in an embodiment of the present disclosure, and FIG. 10B is a schematic cross-sectional diagram of a partial area of the display panel provided in an embodiment of the present disclosure, unlike the display panel, in which film layers are sequentially stacked, described above, the display panels shown in FIGS. 10A and 10B are display panels formed by aligning and assembling. Specifically, the display panel is obtained by aligning and assembling a first display substrate 22 and a second display substrate 21. The first display substrate 22 includes a first base substrate 1 and a light-emitting unit array 2 on the first base substrate 1, and the second display substrate 21 includes a second base substrate 20, and a color control unit array 3 on the second base substrate 20.

After the first display substrate 22 and the second display substrate 21 are aligned and assembled to form the display panel, a first package structure 4, a filling layer, and a second package structure 9 are formed between the light-emitting unit array 2 and the color control unit array 3. The first package structure 4 is configured to package the light-emitting unit array 2, the second package structure 9 is configured to package at least a part of color control units in the color control unit array 3, and the filling layer 24 is configured to fill a gap between the first display substrate 22 and the second display substrate 21. Further, a sealing dam 23 may be provided in peripheral regions of the first base substrate 1 and the second base substrate 20, and the filling layer 24 may fill gaps between the sealing dam 23 and the first display substrate 22, the second display substrate 21.

Figure 10A:
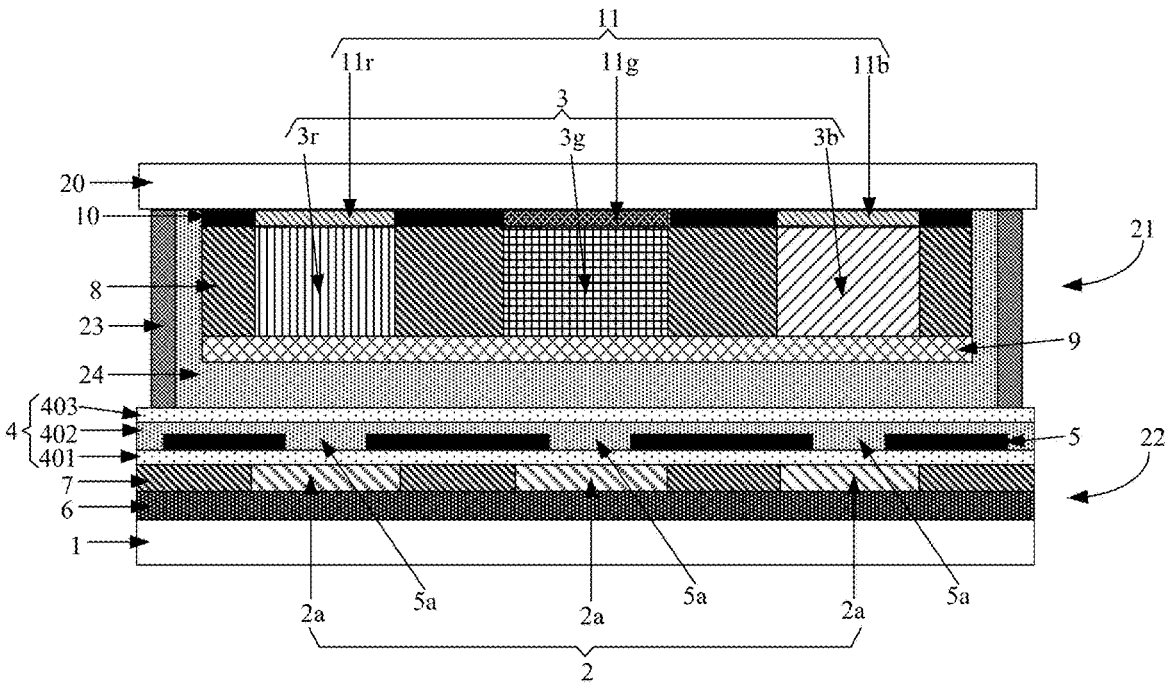
FIG. 10A is a schematic cross-sectional diagram of a partial area of a display panel according to an embodiment of the present disclosure.
Figure 10B:
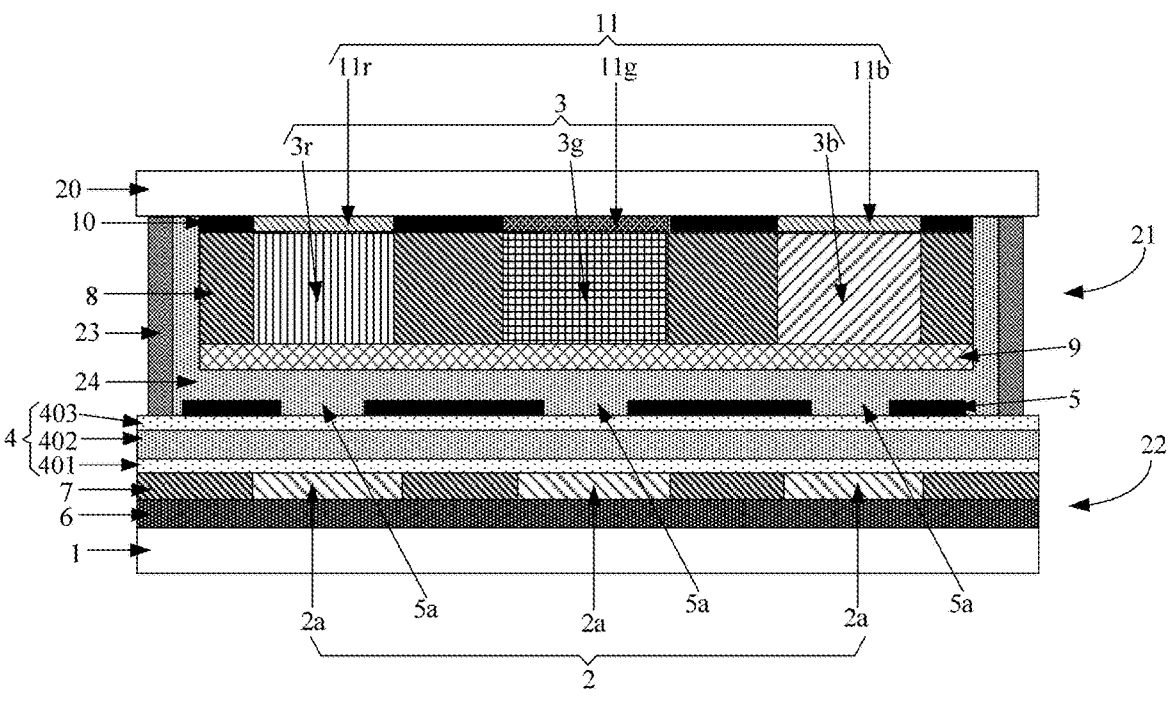
FIG. 10B is a schematic cross-sectional diagram of a partial area of a display panel according to an embodiment of the present disclosure.

It should be noted that FIGS. 10A and 10B only exemplarily show a case where the second package structure 9 packages all the color control units in the color control unit array 3, which is only for exemplary purposes, and does not limit the technical solutions of the present disclosure. In practical applications, at least a part of the color control units in the color control unit array may be selectively packaged by the second package structure 9.

With continued reference to FIG. 10A, the diaphragm structures 5 are embedded in the first package structure 4, and the details thereof may be referred to the foregoing description of FIG. 7, and are not repeated here.

With continued reference to FIG. 10B, the diaphragm structures 5 are located between the first package structure 4 and the color control unit array. In some implementations, the diaphragm structures 5 are located between the first package structure 4 and the filling layer 24, and the diaphragm structures 5 are in contact with the filling layer 24, that is, the diaphragm structures are manufactured on the first display substrate 22.

In some implementations, a color filter pattern array is disposed between the second base substrate 20 and the color control unit array 3. For the related description of the color filter pattern array 11, reference may be made to the corresponding contents in the foregoing description, and details are not repeated herein.

It should be noted that, for relative positions, shapes, sizes, etc., between the light passing portions 5a, and the light-emitting units 2a, the color conversion units corresponding thereto in FIGS. 10A and 10B, reference may be made to the related description of FIGS. 5 and 6, and details are not repeated here.

With continued reference to the figures, in some implementations, at least one dielectric layer is provided between the diaphragm structures 5 and the light-emitting units 2a.

A distance s between a first edge of an orthographic projection of the light passing portion 5a on the first base substrate 1 and a second edge, adjacent to the first edge, of an orthographic projection of the light-emitting unit 2a, corresponding to the light passing portion 5a, on the first base substrate 1 satisfies the following conditions:

$$s = L2 - L1;$$

where L1 is a distance between any two adjacent light-emitting units 2a, and L2 is an offset of the light emitted by the light-emitting unit 2a and having an emergent angle equal to a preset angle when the light reaches a layer structure where the diaphragm structure 5 is located; and $$L2 = \sum_{i=1}^{M} d_i^* \tan \theta_i, \quad \theta_i = \arcsin\left(\frac{N_1^* \sin \theta_1}{N_i}\right),$$

where M is the number of dielectric layers between the diaphragm structure 5 and the light-emitting unit 2a, $d_i$ is a thickness of an $i^{th}$ dielectric layer located between the diaphragm structure 5 and the light-emitting unit 2a and close to the light-emitting unit 2a, and $\theta_i$ is an included angle formed by a direction in which the light emitted by the light-emitting unit 2a and having the emergent angle equal to the preset angle is proporated when the light reaches inside of the $i^{th}$ dielectric layer and a normal of the first base substrate 1, $\theta_1$ is equal to the preset angle, and $N_i$ is a refractive index of the $i^{th}$ dielectric layer.

Figure 11:
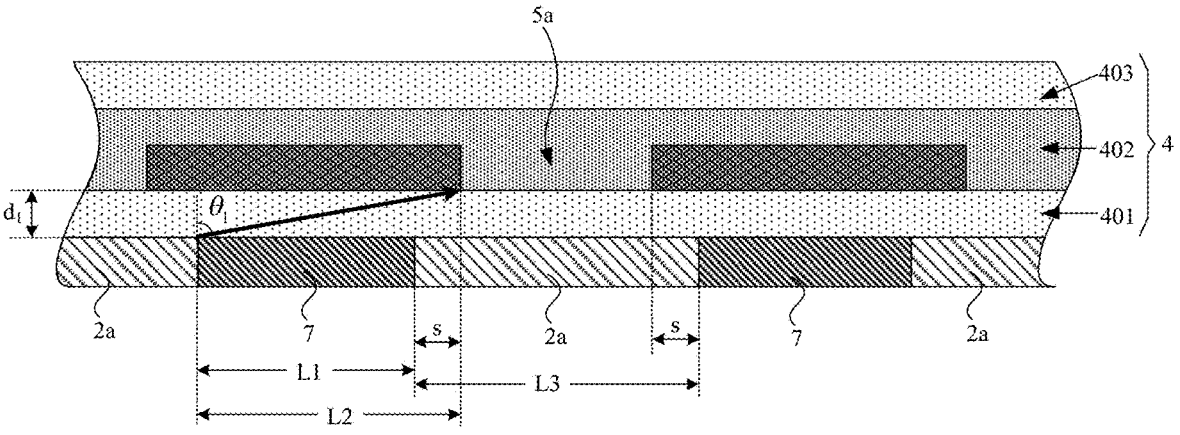
FIG. 11 is a schematic cross-sectional diagram of a partial area of the diaphragm structure and the light-emitting unit in the display panel shown in FIGS. 7 and 9.

The cases shown in FIGS. 7, 9A, and 10A are taken as examples. FIG. 11 is a schematic cross-sectional diagram of a partial area of the diaphragm structure and the light-emitting unit in the display panels shown in FIGS. 7, 9, and 10A, and as shown in FIG. 11, one dielectric layer, and in particular, one first inorganic package layer 401 is disposed between the diaphragm structure 5 and the light-emitting unit 2a.

In this case, the offset L2 of the light emitted by the light-emitting unit 2a, directed to the color control units 3r, 3g, 3b not corresponding to the light-emitting unit 2a and having an emergent angle equal to the preset angle when the light reaches the diaphragm structure 5 meets the following condition: $L2 = d_1 * \tan \theta_1$, where d1 is a thickness of the first inorganic package layer 401, and $\theta_1$ is the preset angle. In order to realize that the diaphragm structure 5 can block the light emitted by a certain light-emitting unit 2a and directed to the color control units 3r, 3g, 3b which do not correspond to the light-emitting unit 2a and having an emergent angle smaller than or equal to the preset angle, a distance s between a first edge of an orthographic projection of the light passing portion 5a on the first base substrate 1 and a second edge, adjacent to the first edge, of an orthographic projection of the light-emitting unit $2a$, corresponding to the light passing portion $5a$, on the first base substrate $1$ satisfies:

$$s \geqslant d_1 \text{*tan } \theta_1 - L1.$$

Figure 12:
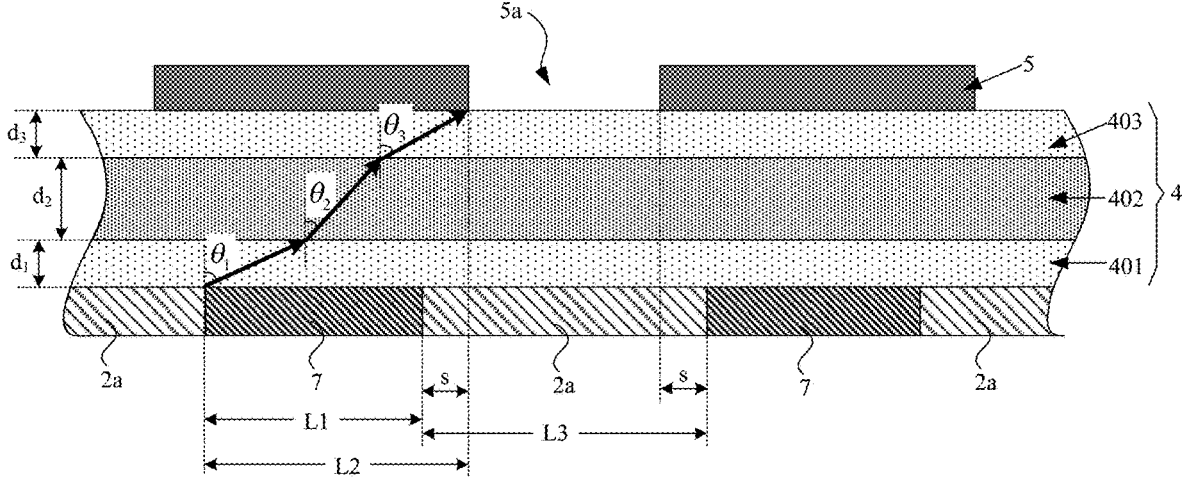
FIG. 12 is a schematic cross-sectional diagram of a partial area of the diaphragm structure and the light-emitting unit in the display panel shown in FIGS. 8 and 10.

The cases shown in FIGS. 8, 9B and 10B are taken as examples. FIG. 12 is a schematic cross-sectional diagram of a partial area of the diaphragm structure 5 and the light-emitting unit $2a$ in the display panels shown in FIGS. 8, 9B and 10B, and as shown in FIG. 12, three dielectric layers, and in particular, a first inorganic package layer 401, an organic package layer 402, and a second inorganic package layer 403, are disposed between the diaphragm structure 5 and the light-emitting unit $2a$.

In this case, the offset L2 of light emitted by the light-emitting unit $2a$ and directed to the color control units $3r$, $3g$, $3b$ not corresponding to the light-emitting unit $2a$, and having an emergent angle equal to the preset angle when the light reaches the diaphragm structure 5 meets the following condition:

$$L2 = d_1 \text{*tan } \theta_1 + d_2 \text{*tan } \theta_2 + d_3 \text{*tan } \theta_3,$$

where d1, d2, and d3 are thicknesses of the first inorganic package layer 401, the organic package layer 402, and the second inorganic package layer 403, respectively, and $\theta_1$ is the preset angle, $\theta_2$ is an included angle between a direction in which the light emitted by the light-emitting unit $2a$ and having the emergent angle equal to the preset angle is propagated when the light reaches the inside of the organic package layer 402 and a normal of the first base substrate $1$, and $\theta_3$ is an included angle between a direction in which the light emitted by the light-emitting unit $2a$ and having the emergent angle equal to the preset angle is propagated when the light reaches the inside of second inorganic package layer 403 and the normal of the first base substrate $1$.

In order to realize that the diaphragm structure 5 can block the light emitted by a certain light-emitting unit $2a$ and directed to the color control units $3r$, $3g$, $3b$ that do not correspond to the light-emitting unit $2a$, and having the emergent angle smaller than or equal to the preset angle, the distance s between the first edge of the orthographic projection of the light passing portion $5a$ on the first base substrate $1$ and the second edge, adjacent to the first edge, of the orthographic projection of the light-emitting unit $2a$, corresponding to the light passing portion $5a$, on the first base substrate $1$ satisfies the following condition:

$$s \geqslant L2 = d_1 \text{*tan } \theta_1 + d_2 \text{ tan } \theta_2 + d^* \text{tan } \theta_3 - L1.$$

In FIGS. 11 and 12, in order to ensure that at least part of the light emitted by the light-emitting unit $2a$ can reach the color control unit $3r$, $3g$ or $3b$ corresponding to the light-emitting unit $2a$ (i.e., the light-transmitting unit $5a$ can be formed), it should be satisfied that 2s is smaller than a width L3 of the light-emitting unit $2a$ in a preset direction (the value of the width L3 may be preset as desired), i.e., $s < L3/2$.

Generally, in a case where the value of the width L3 is constant and the condition $s \geq L2-L1$ is satisfied, the larger the s is, the more the diaphragm structure 5 blocks the light-emitting unit $2a$ corresponding thereto, the smaller the size of the light passing portion $5a$ is, the less the light emitted by the light-emitting unit $2a$ and reaching the color control units $3r$, $3g$ or $3b$ corresponding to the light-emitting unit $2a$ is, and the smaller the rate that the light emitted by the light-emitting unit $2a$ is utilized is. Therefore, $s = L2-L1$ is desired.

It should be noted that the cases shown in FIG. 11 and FIG. 12 are only exemplary, and do not limit the technical solutions of the present disclosure.

In some implementations, a driving layer 6 is further disposed between the first base substrate 1 and the light-emitting units $2a$, the driving layer 6 includes a driving circuit for driving each light-emitting unit $2a$ to emit light, the driving circuit includes thin film transistors (including a driving transistor), and the thin film transistor may be an oxide thin film transistor or a Low Temperature Polysilicon (LTPS) thin film transistor. The process for manufacturing the transistors belongs to the conventional technology in the art and will not be repeated here.

Based on the same inventive concept, an embodiment of the present disclosure further provides a display device, the display device includes the display panel provided in the foregoing embodiment, and for the description of the display panel, reference may be made to the contents of the foregoing embodiment, and details are not repeated here. In some implementations, the display device may be a quantum dot display device.

Figure 13:
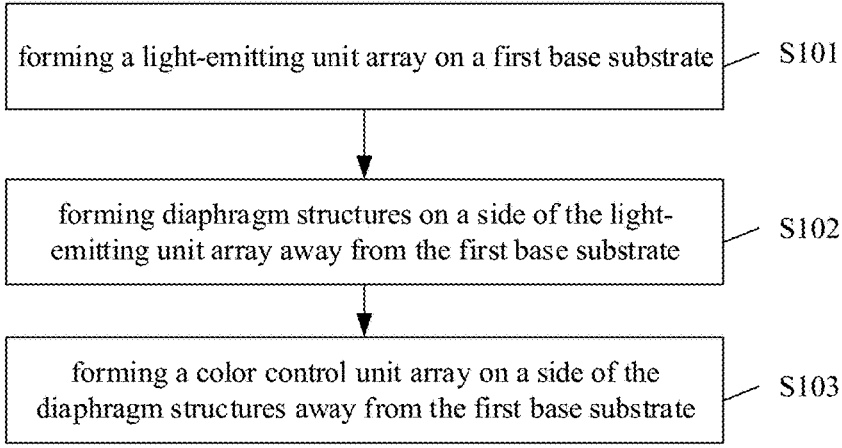
FIG. 13 is a flowchart of a method for manufacturing a display panel according to an embodiment of the present disclosure.

Based on the same inventive concept, an embodiment of the present disclosure further provides a method for manufacturing the display panel provided in the foregoing embodiment. FIG. 13 is a flowchart of the method for manufacturing the display panel according to the embodiment of the present disclosure, and as shown in FIG. 13, the method for manufacturing the display panel includes steps S101 to S103.

At step S101, forming a light-emitting unit array on a first base substrate.

Aa step S102, forming diaphragm structures on a side of the light-emitting unit array, away from the first base substrate, the diaphragm structures being provided with a plurality of light passing portions corresponding to light-emitting units in the light-emitting unit array one to one.

At step S103, forming a color control unit array on a side of the diaphragm structures away from the first base substrate, color control units in the color control unit array corresponding to the light-emitting units in the light-emitting unit array one to one.

An orthographic projection of each light-emitting unit on the first base substrate completely covers an orthographic projection of the light passing portion, corresponding to the light-emitting unit, on the first base substrate, and an area of the orthographic projection of the light-emitting unit on the first base substrate is larger than an area of the orthographic projection of the light passing portion, corresponding to the light-emitting unit, on the first base substrate. Each diaphragm structure is configured to block light emitted by the light-emitting unit and directed to the color control units not corresponding to the light-emitting unit, and to allow part of the light emitted by the light-emitting unit and directed to the color control unit corresponding to the light-emitting unit to be transmitted at the light passing portion corresponding to the light-emitting unit.

For the detailed description of the step S101 and the step S102, reference may be made to the corresponding contents in the foregoing embodiment, and details are not repeated here.

FIG. 14 is a flowchart of another method for manufacturing a display panel according to an embodiment of the present disclosure, and as shown in FIG. 14, the method includes steps S201 to S206.

At step S201, forming a driving layer on a first base substrate.

FIG. 15 is a schematic cross-sectional diagram illustrating an intermediate structure of the display panel obtained after the step S201 is performed, and as shown in FIG. 15, the driving layer is manufactured on the first base substrate 1 by a Thin Film Transistor (TFT) Array process, and the driving layer 6 includes driving circuits for driving the light-emitting units corresponding to the driving circuits to emit light.

At step S202, forming a first pixel defining layer and a light-emitting unit array on the driving layer.

Figure 16:
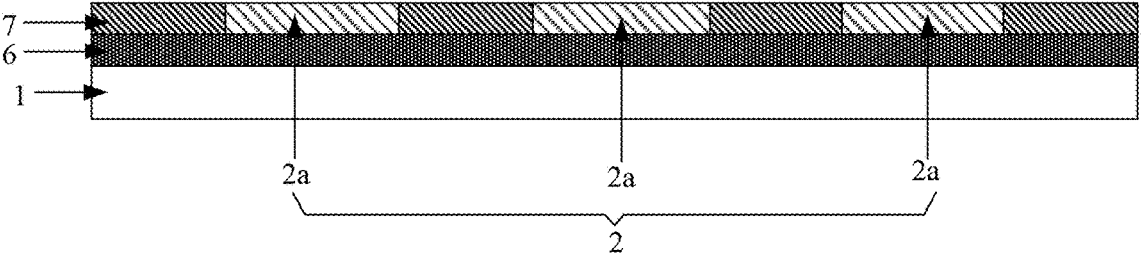
FIG. 16 is a schematic cross-sectional diagram illustrating an intermediate structure of the display panel obtained after step S202.

FIG. 16 is a cross-sectional diagram illustrating an intermediate structure of the display panel obtained after the step S202 is performed, and as shown in FIG. 16, the first pixel defining layer 7 is first manufactured, a plurality of first pixel accommodating holes, corresponding to sub-pixel regions one to one, are formed in the first pixel defining layer 7, and then the light-emitting units 2a are manufactured in the first pixel accommodating holes. Taking the light-emitting unit being an organic light-emitting diode as an example, an anode of the organic light-emitting diode and a drain of the driving transistor are located in a same layer and are shared with each other, in such case, only an organic functional layer capable of emitting light and a cathode are to be manufactured in each first pixel accommodating hole. The organic functional layer at least includes an organic light-emitting layer, and certainly, may further include functional film layers, such as a hole transport layer, a hole blocking layer, an electron transport layer and an electron blocking layer, as desired.

In general, each light-emitting unit 2a is configured with a driving circuit corresponding thereto, the driving circuit includes a driving transistor, and the driving circuit is electrically connected to the light-emitting unit corresponding thereto to drive the light-emitting unit to emit light. In some implementations, the anode of the organic light-emitting diode is made of a metal material (e.g., molybdenum, aluminum, etc.) such that the anode serves as a reflective electrode, and the cathode of the organic light-emitting diode is made of a transparent conductive material (e.g., indium tin oxide, indium gallium zinc oxide, etc.).

At step S203, forming a first package structure and diaphragm structures.

Figure 17:
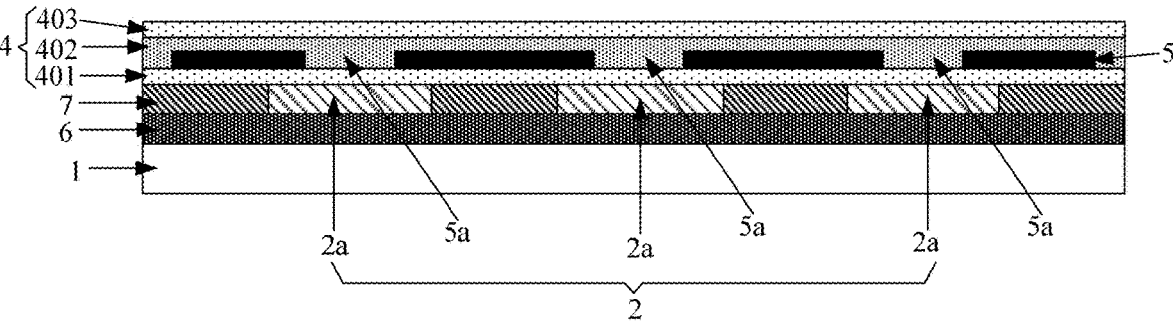
FIG. 17 is a schematic cross-sectional diagram illustrating an intermediate structure of the display panel obtained after step S203.

FIG. 17 is a schematic cross-sectional diagram illustrating an intermediate structure of the display panel obtained after the step S203 is performed, as shown in FIG. 17, in the embodiment of the present disclosure, the diaphragm structures 5 may be embedded in the first package structure 4 (see FIG. 17), or may be located on the first package structure 4 (not shown in the drawings).

Taking a case where the diaphragm structures 5 are embedded in the first package structure 4, and the first package structure and the diaphragm structures are formed as shown in FIGS. 7 and 9 as an example. FIG. 18 is a flowchart of an alternative implementation of the step S203 in the present disclosure, as shown in FIG. 18, the step S203 includes steps S2031a to S2034a.

At step S2031a, forming a first inorganic package layer on a side of the light-emitting units array away from the first base substrate.

The first inorganic package layer may be obtained by depositing a silicon oxide material and/or a silicon nitride material through a CVD process, and a thickness of the first inorganic package layer ranges from about 0.6 μm to about 1.2 μm.

At step S2032a, forming diaphragm structures on a side of the first inorganic package layer away from the first base substrate.

Before the step S2032a is performed, since only the first inorganic package layer 401 is disposed above the light-emitting units, and the inorganic package layer has a poor effect of blocking moisture, in a case where diaphragm structures 5 are manufactured by a conventional photolithography process, it is likely to cause moisture to enter the light-emitting units, thereby causing defects.

In order to prevent moisture from entering the light-emitting units during the process of manufacturing the diaphragm structures 5, the diaphragm structures 5 are to be manufactured by an inkjet printing process in the embodiment. Further, in a nitrogen atmosphere, a resin material having a light-blocking function is formed in a region, where the diaphragm structures 5 are to be formed, by an ink-jet printing process. Compared with the conventional ink-jet printing process implemented in an air atmosphere, the ink-jet printing process implemented in the nitrogen atmosphere in the embodiment of the present disclosure can effectively prevent the moisture in the air from invading into the light-emitting units.

In this case, the step of forming the diaphragm structures 5 may include: firstly, surface treatment is performed on a surface of the first inorganic package layer 401 away from the first base substrate 1, so that the surface of the first inorganic package layer 401 away from the first base substrate 1 is lyophilic in a region where the diaphragm structures 5 are to be formed, and/or the surface of the first inorganic package layer 401 away from the first base substrate 1 is lyophobic in a region where the light passing portions are to be formed; then, a resin material with the light-blocking function is formed in the region, where the diaphragm structures 5 are to be formed, by the ink-jet printing process in the nitrogen atmosphere; next, the resin material is cured to obtain the diaphragm structures 5.

Before the ink-jet printing process is performed, the surface of the first inorganic package layer 401 away from the first base substrate 1 is processed first, so that the region where the diaphragm structures 5 are to be formed is lyophilic and/or the region where the light passing portions are to be formed is lyophobic, thus positions of the resin material to be ejected subsequently during the ink-jet printing process can be accurately defined. A viscosity of the resin material ejected during the ink-jet printing process is about 10 cp, a surface tension of the resin material is about 35 mN/m, and the resin material is a resin material having the light-blocking function, i.e, capable of blocking light, for example, is a black resin material. An OD value of the diaphragm structures 5 obtained after the resin material has been cured is greater than 1.

Step S2033a, forming an organic package layer on a side of the diaphragm structures away from the first base substrate.

In the step S2033a, the organic package layer 402 may be manufactured by ink-jet printing a transparent resin material, a thickness of the organic package layer 402 ranges from about 6 μm to about 8 μm, and the organic package layer 402 may also play a role of planarization.

At step S2034a, forming a second inorganic package layer on a side of the organic package layer away from the first base substrate.

In the step S2034a, the second inorganic package layer 403 is formed by depositing a silicon oxide material and/or a silicon nitride material by CVD process, and has a thickness ranging from about 0.6 μm to about 1.2 μm.

FIG. 19 is a flowchart of another alternative implementation of the step S203 in the present disclosure, as shown in FIG. 19, the step S203 includes steps S2031b and S2032b.

At step S2031*b*, forming a first package structure.

The step of forming the first package structure 4 includes a step of forming a first inorganic package layer, a step of forming an organic package layer, and a step of forming a second inorganic package layer.

At step S2032*b*, forming diaphragm structures on a side of the first package structure away from the first base substrate.

The step of forming the diaphragm structures 5 includes: forming the diaphragm structures 5 on the side of the first package structure 4 away from the first base substrate by an ink-jet printing process or a photolithography process.

Since the diaphragm structures 5 are manufactured after the first package structure 4 is manufactured, in such case, the first package structure 4 has packaged the light-emitting units, and can block moisture well, the diaphragm structures 5 may be manufactured by adopting an ink-jet printing process or a photolithography process.

At step S204, forming a second pixel defining layer, a color control unit array and a second package structure.

Figure 20:
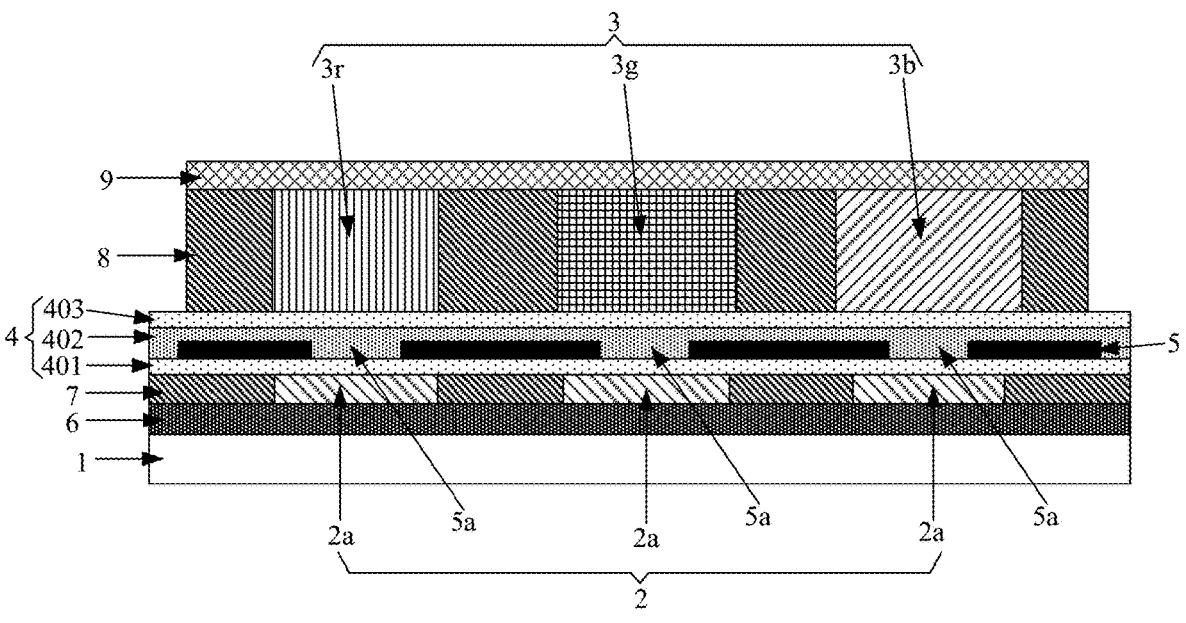
FIG. 20 is a schematic cross-sectional diagram illustrating an intermediate structure of the display panel obtained after step S204.

FIG. 20 is a cross-sectional diagram illustrating an intermediate structure of the display panel obtained after step S204 is performed, as shown in FIG. 20, in step S204, the second pixel defining layer 8 is first manufactured, the second pixel defining layer 8 is provided therein with a plurality of second pixel accommodating holes corresponding to the sub-pixel regions one to one, then the color control units 3*r*, 3*g*, 3*b* are formed in the second pixel accommodating holes, and then the second package structure 9 is formed on a side of the color control unit array away from the first base substrate.

In some implementations, a material of the color control units 3*r*, 3*g*, 3*b* in the color control unit array 3 includes a quantum dot material. Taking a case where the sub-pixel regions include a red sub-pixel region, a green sub-pixel region, and a blue sub-pixel region as an example, the red color conversion unit 3*r*, the green color conversion unit 3*g*, and the blue light transmission unit 3*b* may be respectively manufactured in the red sub-pixel region, the green sub-pixel region, and the blue sub-pixel region.

In some implementations, the color control units 3*r*, 3*g*, 3*b* each have a thickness ranging from about 6 μm to about 15 μm.

The second package structure 9 adopts a single layer of inorganic material film made of silicon nitride or silicon oxide, or the second package structure 9 adopts a stacked structure of an organic material film and an inorganic material film. The second package structure 9 can prevent external moisture from entering the color control units, thereby preventing the external moisture from damaging the performance of the color control units.

Figure 21:
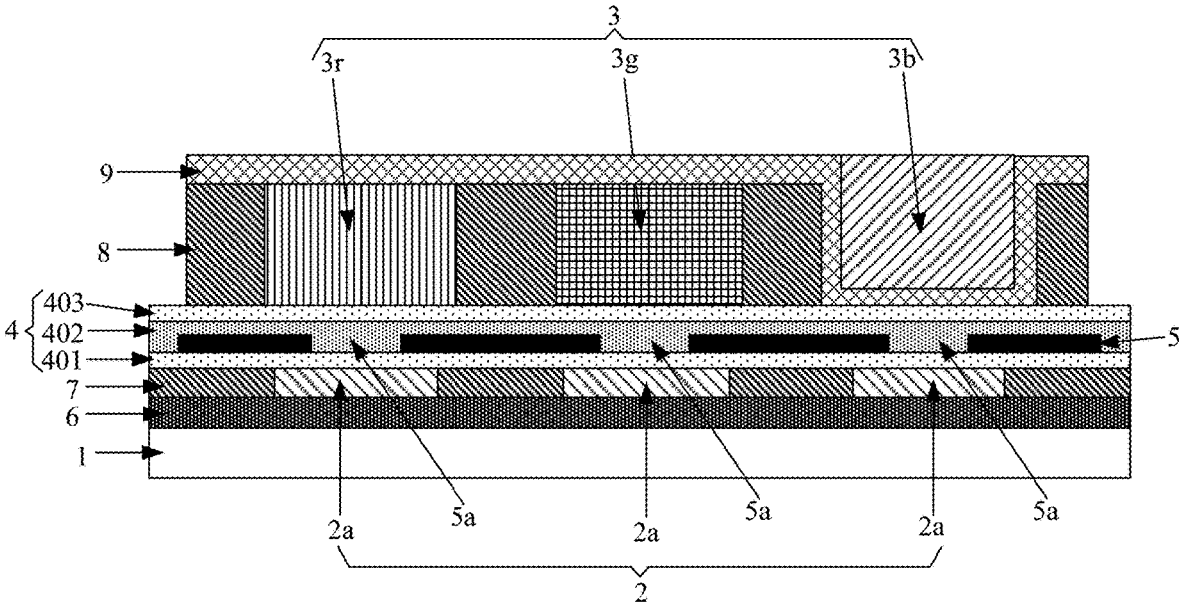
FIG. 21 is a schematic cross-sectional diagram illustrating an intermediate structure of the display panel obtained after step S204.

FIG. 21 is another schematic cross-sectional diagram illustrating an intermediate structure of the display panel obtained after step S204 is performed, unlike the case where the second package structure shown in FIG. 20 packages all the color control units 3*r*, 3*g*, 3*b* in the color control unit array 3, the second package structure shown in FIG. 21 may only package a part of the color control units. In such case, in the step S204, a part of the color control units to be packaged by the second package structure 9 may be first manufactured in a portion of the first pixel accommodating holes, and then the second package structure is manufactured, and then the color control units not to be packaged by the second package structure 9 are manufactured.

Taking a case where the second package structure shown in FIG. 21 packages only the red color conversion unit 3*r* and the green color conversion unit 3*g*, and does not package the blue light transmission unit 3*b* as an example, the red color conversion unit 3*r* and the green color conversion unit 3*g* may be manufactured first, then the second package structure 9 is manufactured, and next the blue light transmission unit 3*b* is manufactured.

At step S205, forming a black matrix and a color filter pattern array on the second package structure.

Figure 22:
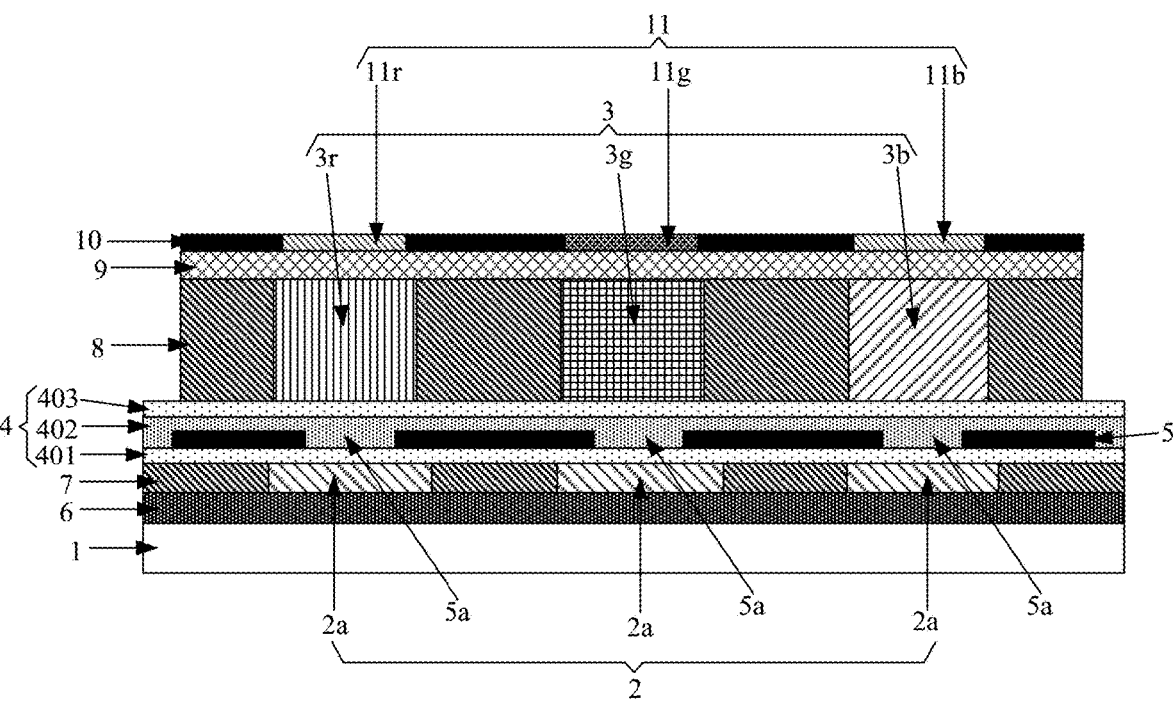
FIG. 22 is a schematic cross-sectional diagram illustrating an intermediate structure of the display panel obtained after step S205.

FIG. 22 is a schematic cross-sectional diagram illustrating an intermediate structure of the display panel obtained after step S205 is performed, as shown in FIG. 22, as an alternative implementation, the color control units in the color control unit array 3 may include a red color conversion unit 3*r*, a green color conversion unit 3*g* and a blue light transmission unit 3*b*, and color filter patterns in the color filter pattern array 11 may include: a red color filter pattern 11*r* (located in the red sub-pixel region) corresponding to the red color conversion unit 3*r*, a green color filter pattern 11*g* (located in the green sub-pixel region) corresponding to the green color conversion unit 3*g*, and a blue color filter pattern 11*b* (located in the blue sub-pixel region) corresponding to the blue light transmission unit 3*b*. The color filter patterns 11*r*, 11*g*, 11*b* can perform color filtering on light emitted from the color control units 3*r*, 3*g*, 3*b*, thus, the sub-pixel regions corresponding to the color control units 3*r*, 3*g*, 3*b* have higher light purity and better color saturation, so that the color display effect of the display panel is improved.

At step S206, forming a third package structure on a side of the color filter pattern array away from the first base substrate.

Referring to FIGS. 9A to 9D, the third package structure 12 may be made of a low-temperature transparent resin material; the third package structure 12 can package not only the color filter pattern array 11, but also the entire display panel, so as to prevent the film layers inside the display panel from being damaged by external factors.

Figure 23:
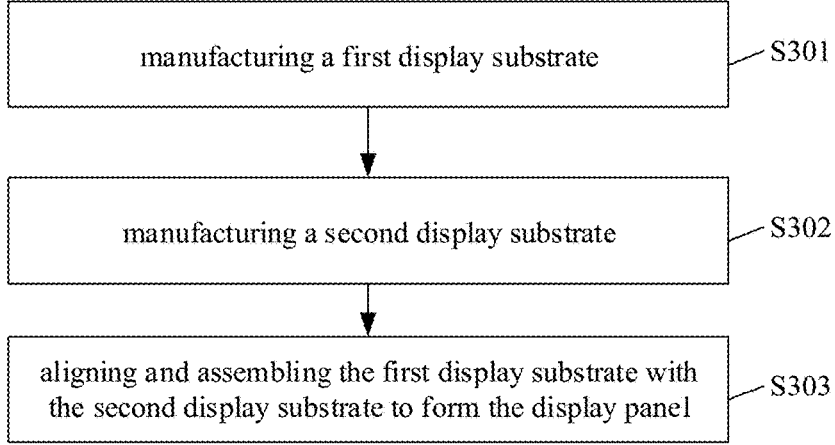
FIG. 23 is a flowchart of a method for manufacturing a display panel according to an embodiment of the present disclosure.

FIG. 23 is a flowchart of a method for manufacturing a display panel according to an embodiment of the present disclosure, and as shown in FIG. 23, the method includes steps S301 to S303.

At step S301, manufacturing a first display substrate.

Figure 24:
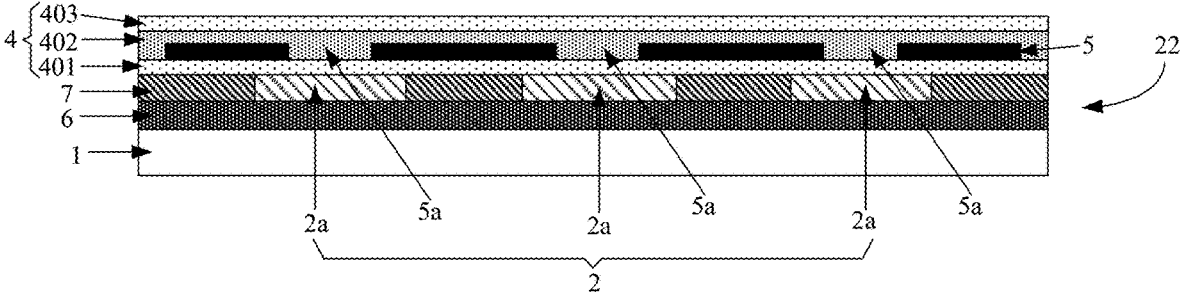
FIG. 24 is a schematic cross-sectional diagram of a first display substrate obtained after step S301.

FIG. 24 is a schematic cross-sectional diagram of the first display substrate obtained after the step S301 is performed, and as shown in FIG. 24, steps S201 to S203 in the foregoing embodiment may be adopted to manufacture a driving layer 6, a first pixel defining layer 7, a light-emitting unit array 2, a first package structure 4 and diaphragm structures 5 on a first base substrate to obtain the first display substrate 22. For the manufacturing process, reference may be made to the related description of step S201 to step S203 in the foregoing embodiment, and details are not repeated here. The diaphragm structures 5 may be embedded in the first package structure 4 (see FIG. 24), or may be located on the first package structure 4 (not shown in the drawings).

At step S302, manufacturing a second display substrate.

Figure 25:
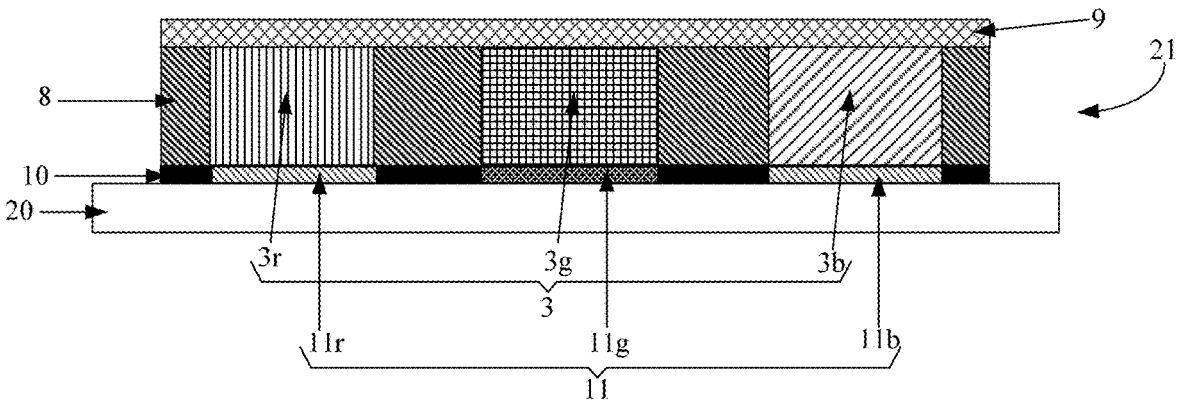
FIG. 25 is a schematic cross-sectional diagram of a second display substrate obtained after step S302.

FIG. 25 is a schematic cross-sectional diagram of the second display substrate obtained after the step S302 is performed, and as shown in FIG. 25, a black matrix 10, a color filter pattern array 11, a second pixel defining layer 8, a color control unit array 3 and a second package structure 9 are formed on a second base substrate to obtain the second display substrate 21.

Sequence of the step S301 and the step S302 is not limited in the technical solution of the present disclosure.

At step S303, aligning and assembling the first display substrate with the second display substrate to form the display panel.

Referring to FIGS. 10A and 10B, the first display substrate 22 and the second display substrate 21 are aligned and assembled to obtain the display panel.

It will be understood that the above embodiments are merely exemplary embodiments adopted to illustrate the principles of the present disclosure, and the present disclosure is not limited thereto. It will be apparent to those skilled in the art that various modifications and improvements may be made without departing from the spirit and scope of the present disclosure, and such modifications and improvements are also considered to be within the scope of the present disclosure.

What is claimed is:

1. A display panel, comprising:

a first base substrate;

a light-emitting unit array and a color control unit array, the color control unit array being located on a side of the light-emitting unit array away from the first base substrate, and color control units in the color control unit array correspond to light-emitting units in the light-emitting unit array one to one;

at least part of the light-emitting units are provided with diaphragm structures corresponding to the light-emitting units one to one, the diaphragm structures being located between the light-emitting units and the color control units, and each diaphragm structure being provided with a light passing portion therein;

an orthographic projection of the light passing portion on the first base substrate is overlapped with an orthographic projection of the light-emitting unit, corresponding to the light passing portion, on the first base substrate, and an area of the orthographic projection of the light passing portion on the first base substrate is smaller than an area of the orthographic projection of the light-emitting unit, corresponding to the light passing portion, on the first base substrate;

each of the diaphragm structures is configured to block light emitted by the light-emitting unit corresponding thereto and directed to the color control units not corresponding to the light-emitting unit, and to allow part of light emitted by the light-emitting unit and directed to the color control unit corresponding to the light-emitting unit to be transmitted at the light passing portion corresponding to the light-emitting unit, wherein the display panel further comprises a second package structure, a color filter pattern array and a third package structure sequentially located on a side of the color control units away from the first base substrate, and the third package structure is configured to package a surface of the color filter pattern array away from the base substrate and side surfaces of the color filter pattern array.

2. The display panel of claim 1, wherein the orthographic projection of the light passing portion on the first base substrate is located within the orthographic projection of the light-emitting unit, corresponding to the light passing portion, on the first base substrate.

3. The display panel of claim 2, wherein the diaphragm structure is configured to block light emitted by the light-emitting unit corresponding thereto, directed to the color control units not corresponding to the light-emitting unit and having an emergent angle smaller than or equal to a preset angle, wherein the emergent angle of the light is an included angle formed between the light and a normal of the first base substrate;

at least one dielectric layer is provided between the diaphragm structures and the light-emitting units;

a distance s between a first edge of the orthographic projection of the light passing portion on the first base substrate and a second edge, adjacent to the first edge, of the orthographic projection of the light-emitting unit, corresponding to the light passing portion, on the first base substrate satisfies the following conditions:

$$s = L2 - L1;$$

wherein L1 is a spacing between any two adjacent light-emitting units, and L2 is an offset of the light emitted by the light-emitting unit and having the emergent angle equal to the preset angle when the light reaches a layer structure where the diaphragm structure is located;

$$L2 = \sum_{i=1}^{M} d_i^* \tan \theta_i, \quad \theta_i = \arcsin\left(\frac{N_1^* \sin \theta_1}{N_i}\right),$$

M is the number of dielectric layers between the diaphragm structures and the light-emitting units corresponding to the diaphragm structures, $d_i$ is a thickness of an $i^{th}$ dielectric layer which is located between the diaphragm structures and the light-emitting units corresponding to the diaphragm structures and is close to the light-emitting units, and $\theta_i$ is an included angle formed between a direction in which the light emitted by the light-emitting unit and having the emergent angle equal to the preset angle is propagated when the light reaches inside of the $i^{th}$ dielectric layer and the normal of the first base substrate, and $\theta_i$ is equal to the preset angle, and $N_i$ is a refractive index of the $i^{th}$ dielectric layer.

4. The display panel of claim 1, wherein the orthographic projection of the light passing portion on the first base substrate and the orthographic projection of the light-emitting unit, corresponding to the light passing portion, on the first base substrate are the same in shape and having center points coincide with each other, and the orthographic projection of the light passing portion on the first base substrate and an orthographic projection of the color control unit, corresponding to the light passing portion, on the first base substrate are the same in shape and having center points coincide with each other.

5. The display panel of any one of claim 1, further comprising:

a first package structure located between the light-emitting unit array and the color control unit array, the first package structure being configured to package the light-emitting unit array;

the color control units are in contact with the first package structure.

6. The display panel of any one of claim 1, further comprising:

a first package structure located between the light-emitting unit array and the color control unit array, the first package structure being configured to package the light-emitting unit array; wherein the second package structure and a filling layer are located between at least part of the color control units in the color control unit array and the first package structure, the filling layer being located between the second package structure and the first package structure, and the second package structure being configured to package the at least part of the color control units.

7. The display panel of claim 5, wherein the diaphragm structures are embedded in the first package structure, and the first package structure comprises:

a first inorganic package layer; and an organic package layer located on a side of the first inorganic package layer away from the first base substrate and being in contact with the first inorganic package layer, wherein the diaphragm structures are located between the first inorganic package layer and the organic package layer.

8. The display panel of claim 5, wherein the diaphragm structures are located between the first package structure and the color control unit array, and the diaphragm structures are in contact with the color control units.

9. The display panel of claim 6, wherein the diaphragm structures are located between the first package structure and the color control unit array, and the diaphragm structures are located between the first package structure and the filling layer, and the diaphragm structures are in contact with the filling layer.

10. The display panel of claim 5, wherein the second package structure is at least partially located on a side of the color control units away from the first base substrate, and is configured to package at least part of the color control units in the color control unit array;

the color filter pattern array is located on a side of the second package structure away from the first base substrate, and color filter patterns in the color filter pattern array correspond to the color control units in the color control unit array one to one.

11. The display panel of claim 6, wherein an orthographic projection of each color control unit on the first base substrate is located within a region covered by the orthographic projection of the light passing portion, corresponding to the color control unit, on the first base substrate.

12. The display panel of claim 6, further comprising:

a second base substrate located on a side of the color filter pattern array away from the first base substrate, wherein the color filter pattern array is located on a side of the color control unit array away from the first base substrate, and color filter patterns in the color filter pattern array correspond to the color control units in the color control unit array one to one.

13. The display panel of claim 3, wherein the orthographic projection of the light passing portion on the first base substrate is located within an orthographic projection of the color control unit, corresponding to the light passing portion, on the first base substrate, and the orthographic projection of each light-emitting unit on the first base substrate is located within the orthographic projection of the color control unit, corresponding to the light-emitting unit, on the first base substrate, the preset angle is equal to or less than about 60°, and an optical density of a portion of the diaphragm structure outside a region where light passing portions are located is greater than 1.

14. The display panel of claim 1, further comprising:

a second pixel defining layer provided with an array of second pixel accommodating holes, the second pixel accommodating holes correspond to the color control units in the color control unit array one to one, and the color control units in the color control unit array are located in the second pixel accommodating holes corresponding to the color control units, wherein the second pixel defining layer has a thickness three times a thickness of each of the diaphragm structures or more.

15. The display panel of claim 1, wherein a slope angle of each side wall of each diaphragm structure enclosing the light passing portion ranges from about 30° to about 90°; and a material of the diaphragm structure comprises a resin material capable of blocking light.

16. The display panel of claim 1, wherein each light-emitting unit emits light of a preset color;

each color control unit in the color control unit array is selected from a color conversion unit or a light transmission unit, the color conversion unit being configured to convert the light of the preset color into light of another color; and the light transmission unit is configured to transmit the light of the preset color, and wherein a material of the color conversion unit comprises a quantum dot material; and a material of the light transmission unit comprises a transparent resin and scattering particles distributed in the transparent resin.

17. The display panel of claim 16, wherein in response to that the display panel comprises a second package structure, and the color control units are packaged by the second package structure and comprises at least color conversion units.

18. The display panel of claim 1, further comprising:

a first pixel defining layer provided with an array of first pixel accommodating holes, the first pixel accommodating holes correspond to the light-emitting units in the light-emitting unit array one to one, and the light-emitting units are located in the first pixel accommodating holes corresponding to the light-emitting units.

19. The display panel of claim 18, further comprising a diaphragm layer, the diaphragm layer comprising the plurality of diaphragm structures corresponding to the light-emitting units one to one, and light passing portions in the diaphragm structures are light passing holes;

an orthographic projection of the diaphragm layer on the first base substrate completely covers an orthographic projection of the first pixel defining layer on the first base substrate, and an area of the orthographic projection of the diaphragm layer on the first base substrate is larger than an area of the orthographic projection of the first pixel defining layer on the first base substrate.

20. A display device, comprising the display panel of claim 1.

* * * * *